(12) United States Patent
Shanmugasundram et al.

(10) Patent No.: US 6,913,938 B2
(45) Date of Patent: Jul. 5, 2005

(54) FEEDBACK CONTROL OF PLASMA-ENHANCED CHEMICAL VAPOR DEPOSITION PROCESSES

(75) Inventors: Arulkumar P. Shanmugasundram, Sunnyvale, CA (US); Alexander T. Schwarm, Austin, TX (US); Ilias Iliopoulos, San Bruno, CA (US); Alexander Parkhomovsky, Santa Clara, CA (US); Martin J. Seamons, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 18 days.

(21) Appl. No.: 10/174,370

(22) Filed: Jun. 18, 2002

(65) Prior Publication Data

US 2003/0049390 A1 Mar. 13, 2003

Related U.S. Application Data

(60) Provisional application No. 60/298,878, filed on Jun. 19, 2001, provisional application No. 60/349,576, filed on Oct. 29, 2001, and provisional application No. 60/366,699, filed on Mar. 21, 2002.

(51) Int. Cl.$^7$ .......................... H01L 21/66; G05B 13/04
(52) U.S. Cl. ................... 438/16; 427/9; 700/31
(58) Field of Search .................. 438/16, 680; 427/9, 427/585; 118/665, 697; 700/29, 30, 31, 44, 45, 108, 121; 702/81, 82, 170; 717/114; 356/237.5, 630

(56) References Cited

U.S. PATENT DOCUMENTS

| | | |
|---|---|---|
| 3,205,485 A | 9/1965 | Noltingk |
| 3,229,198 A | 1/1966 | Libby |
| 3,767,900 A | 10/1973 | Chao et al. |
| 3,920,965 A | 11/1975 | Sohrwardy |
| 4,000,458 A | 12/1976 | Miller et al. |
| 4,207,520 A | 6/1980 | Flora et al. |

(Continued)

FOREIGN PATENT DOCUMENTS

| | | |
|---|---|---|
| CA | 2165847 | 3/1992 |
| CA | 2194855 | 3/1992 |

(Continued)

OTHER PUBLICATIONS

Dishon, G., D. Eylon, M. Finarov, and A. Shulman. "Dielectric CMP Advanced Process Control Based on Integrated Monitoring." Ltd. Rehoveth, Israel: Nova Measuring Instruments. Feb. 19–20, 1998.

(Continued)

Primary Examiner—Matthew Smith
Assistant Examiner—Lex H. Malsawma
(74) Attorney, Agent, or Firm—Wilmer Cutler Pickering Hale & Dorr

(57) ABSTRACT

A method of film deposition in a chemical vapor deposition (CVD) process includes (a) providing a model for CVD deposition of a film that defines a plurality of regions on a wafer and identifies one or more film properties for at least two regions of the wafer and at least one deposition model variable that correlates with the one or more film properties; (b) depositing a film onto a wafer using a first deposition recipe comprising at least one deposition recipe parameter that corresponds to the at least one deposition variable; (c) measuring a film property of at least one of the one or more film properties for the deposited film of step (b) for each of the at least two regions of the wafer and determining a film property; (d) calculating an updated deposition model based upon the film property of step (c) and the model of step (a); and (e) calculating an updated deposition recipe based upon the updated model of step (d) to maintain a target film property. The method can be used to provide feedback to a plurality of deposition chambers or to control film properties other than film thickness.

81 Claims, 8 Drawing Sheets

U.S. PATENT DOCUMENTS

| | | |
|---|---|---|
| 4,209,744 A | 6/1980 | Gerasimov et al. |
| 4,302,721 A | 11/1981 | Urbanek et al. |
| 4,368,510 A | 1/1983 | Anderson |
| 4,609,870 A | 9/1986 | Lale et al. |
| 4,616,308 A | 10/1986 | Morshedi et al. |
| 4,663,703 A | 5/1987 | Axelby et al. |
| 4,698,766 A | 10/1987 | Entwistle et al. |
| 4,750,141 A | 6/1988 | Judell et al. |
| 4,755,753 A | 7/1988 | Chern |
| 4,757,259 A | 7/1988 | Charpentier |
| 4,796,194 A | 1/1989 | Atherton |
| 4,901,218 A | 2/1990 | Cornwell |
| 4,938,600 A | 7/1990 | Into |
| 4,957,605 A * | 9/1990 | Hurwitt et al. ........ 204/192.12 |
| 4,967,381 A | 10/1990 | Lane et al. |
| 4,974,543 A | 12/1990 | Jansen |
| 5,089,970 A | 2/1992 | Lee et al. |
| 5,108,570 A | 4/1992 | Wang |
| 5,208,765 A | 5/1993 | Turnbull |
| 5,220,517 A | 6/1993 | Sierk et al. |
| 5,226,118 A | 7/1993 | Baker et al. |
| 5,231,585 A | 7/1993 | Kobayashi et al. |
| 5,236,868 A | 8/1993 | Nulman |
| 5,240,552 A | 8/1993 | Yu et al. |
| 5,260,868 A | 11/1993 | Gupta et al. |
| 5,270,222 A | 12/1993 | Moslehi |
| 5,283,141 A | 2/1994 | Yoon et al. |
| 5,295,242 A | 3/1994 | Mashruwala et al. |
| 5,309,221 A | 5/1994 | Fischer et al. |
| 5,329,463 A | 7/1994 | Sierk et al. |
| 5,338,630 A | 8/1994 | Yoon et al. |
| 5,347,446 A | 9/1994 | Iino et al. |
| 5,367,624 A | 11/1994 | Cooper |
| 5,369,544 A | 11/1994 | Mastrangelo |
| 5,375,064 A | 12/1994 | Bollinger |
| 5,398,336 A | 3/1995 | Tantry et al. |
| 5,402,367 A | 3/1995 | Sullivan et al. |
| 5,408,405 A | 4/1995 | Mozumder et al. |
| 5,410,473 A | 4/1995 | Kaneko et al. |
| 5,420,796 A | 5/1995 | Weling et al. |
| 5,427,878 A | 6/1995 | Corliss |
| 5,444,837 A | 8/1995 | Bomans et al. |
| 5,469,361 A | 11/1995 | Moyne |
| 5,485,082 A | 1/1996 | Wisspeintner et al. |
| 5,490,097 A | 2/1996 | Swenson et al. |
| 5,495,417 A | 2/1996 | Fuduka et al. |
| 5,497,316 A | 3/1996 | Sierk et al. |
| 5,497,381 A | 3/1996 | O'Donoghue et al. |
| 5,503,707 A | 4/1996 | Maung et al. |
| 5,508,947 A | 4/1996 | Sierk et al. |
| 5,511,005 A | 4/1996 | Abbe et al. |
| 5,519,605 A | 5/1996 | Cawlfield |
| 5,525,808 A | 6/1996 | Irie et al. |
| 5,526,293 A | 6/1996 | Mozumder et al. |
| 5,534,289 A | 7/1996 | Bilder et al. |
| 5,541,510 A | 7/1996 | Danielson |
| 5,546,312 A | 8/1996 | Mozumder et al. |
| 5,553,195 A | 9/1996 | Meijer |
| 5,586,039 A | 12/1996 | Hirsch et al. |
| 5,599,423 A | 2/1997 | Parker et al. |
| 5,602,492 A | 2/1997 | Cresswell et al. |
| 5,603,707 A | 2/1997 | Trombetta et al. |
| 5,617,023 A | 4/1997 | Skalski |
| 5,621,241 A | 4/1997 | Jain |
| 5,627,083 A | 5/1997 | Tounai |
| 5,629,216 A | 5/1997 | Wijaranakula et al. |
| 5,642,296 A | 6/1997 | Saxena |
| 5,646,870 A | 7/1997 | Krivokapic et al. |
| 5,649,169 A | 7/1997 | Berezin et al. |
| 5,654,903 A | 8/1997 | Reitman et al. |
| 5,655,951 A | 8/1997 | Meikle et al. |
| 5,657,254 A | 8/1997 | Sierk et al. |
| 5,660,895 A | 8/1997 | Lee et al. |
| 5,661,669 A | 8/1997 | Mozumder et al. |
| 5,663,797 A | 9/1997 | Sandhu |
| 5,664,987 A | 9/1997 | Renteln |
| 5,665,199 A | 9/1997 | Sahota et al. |
| 5,665,214 A * | 9/1997 | Iturralde ................ 204/298.03 |
| 5,666,297 A | 9/1997 | Britt et al. |
| 5,667,424 A | 9/1997 | Pan |
| 5,674,787 A | 10/1997 | Zhao et al. |
| 5,694,325 A | 12/1997 | Fukuda et al. |
| 5,695,810 A | 12/1997 | Dubin et al. |
| 5,698,989 A | 12/1997 | Nulman |
| 5,719,495 A | 2/1998 | Moslehi |
| 5,719,796 A | 2/1998 | Chen |
| 5,735,055 A | 4/1998 | Hochbein et al. |
| 5,740,429 A | 4/1998 | Wang et al. |
| 5,751,582 A | 5/1998 | Saxena et al. |
| 5,754,297 A | 5/1998 | Nulman |
| 5,761,064 A | 6/1998 | La et al. |
| 5,761,065 A | 6/1998 | Kittler et al. |
| 5,764,543 A | 6/1998 | Kennedy |
| 5,777,901 A | 7/1998 | Berezin et al. |
| 5,787,021 A | 7/1998 | Samaha |
| 5,787,269 A | 7/1998 | Hyodo |
| 5,808,303 A | 9/1998 | Schlagheck et al. |
| 5,812,407 A | 9/1998 | Sato et al. |
| 5,823,854 A | 10/1998 | Chen |
| 5,824,599 A | 10/1998 | Schacham-Diamand et al. |
| 5,825,356 A | 10/1998 | Habib et al. |
| 5,825,913 A | 10/1998 | Rostami et al. |
| 5,828,778 A | 10/1998 | Hagi et al. |
| 5,831,851 A | 11/1998 | Eastburn et al. |
| 5,832,224 A | 11/1998 | Fehskens et al. |
| 5,838,595 A | 11/1998 | Sullivan et al. |
| 5,838,951 A | 11/1998 | Song |
| 5,844,554 A | 12/1998 | Geller et al. |
| 5,857,258 A | 1/1999 | Penzes et al. |
| 5,859,777 A | 1/1999 | Yokoyama et al. |
| 5,859,964 A | 1/1999 | Wang et al. |
| 5,859,975 A | 1/1999 | Brewer et al. |
| 5,862,054 A | 1/1999 | Li |
| 5,863,807 A | 1/1999 | Jang et al. |
| 5,867,389 A | 2/1999 | Hamada et al. |
| 5,870,306 A | 2/1999 | Harada |
| 5,871,805 A * | 2/1999 | Lemelson ..................... 427/8 |
| 5,874,345 A | 2/1999 | Coronel et al. |
| 5,883,437 A | 3/1999 | Maruyama et al. |
| 5,889,991 A | 3/1999 | Consolatti et al. |
| 5,901,313 A | 5/1999 | Wolf et al. |
| 5,903,455 A | 5/1999 | Sharpe, Jr. et al. |
| 5,910,011 A | 6/1999 | Cruse |
| 5,910,846 A | 6/1999 | Sandhu |
| 5,912,678 A | 6/1999 | Saxena et al. |
| 5,916,016 A | 6/1999 | Bothra |
| 5,923,553 A | 7/1999 | Yi |
| 5,926,690 A | 7/1999 | Toprac et al. |
| 5,930,138 A | 7/1999 | Lin et al. |
| 5,937,323 A | 8/1999 | Orcyzk et al. |
| 5,940,300 A | 8/1999 | Ozaki |
| 5,943,237 A | 8/1999 | Van Boxem |
| 5,943,550 A | 8/1999 | Fulford, Jr. et al. |
| 5,960,185 A | 9/1999 | Nguyen |
| 5,960,214 A | 9/1999 | Sharpe, Jr. et al. |
| 5,961,369 A | 10/1999 | Bartels et al. |
| 5,963,881 A | 10/1999 | Kahn et al. |
| 5,975,994 A | 11/1999 | Sandhu et al. |
| 5,978,751 A | 11/1999 | Pence et al. |
| 5,982,920 A | 11/1999 | Tobin, Jr. et al. |
| 6,002,989 A | 12/1999 | Shiba et al. |

| | | | | | | |
|---|---|---|---|---|---|---|
| 6,012,048 A | 1/2000 | Gustin et al. | 6,259,160 B1 | 7/2001 | Lopatin et al. | |
| 6,017,771 A | 1/2000 | Yang et al. | 6,263,255 B1 | 7/2001 | Tan et al. | |
| 6,036,349 A | 3/2000 | Gombar | 6,268,270 B1 | 7/2001 | Scheid et al. | |
| 6,037,664 A | 3/2000 | Zhao et al. | 6,271,670 B1 | 8/2001 | Caffey | |
| 6,041,263 A | 3/2000 | Boston et al. | 6,276,989 B1 | 8/2001 | Campbell et al. | |
| 6,041,270 A | 3/2000 | Steffan et al. | 6,277,014 B1 | 8/2001 | Chen et al. | |
| 6,054,379 A | 4/2000 | Yau et al. | 6,278,899 B1 | 8/2001 | Piche et al. | |
| 6,059,636 A | 5/2000 | Inaba et al. | 6,280,289 B1 | 8/2001 | Wiswesser et al. | |
| 6,064,759 A | 5/2000 | Buckley et al. | 6,281,127 B1 | 8/2001 | Shue | |
| 6,072,313 A | 6/2000 | Li et al. | 6,284,622 B1 | 9/2001 | Campbell et al. | |
| 6,074,443 A | 6/2000 | Venkatesh et al. | 6,287,879 B1 | 9/2001 | Gonzales et al. | |
| 6,077,412 A | 6/2000 | Ting et al. | 6,290,572 B1 | 9/2001 | Hofmann | |
| 6,078,845 A | 6/2000 | Friedman | 6,291,367 B1 | 9/2001 | Kelkar | |
| 6,094,688 A | 7/2000 | Mellen-Garnett et al. | 6,292,708 B1 | 9/2001 | Allen et al. | |
| 6,096,649 A | 8/2000 | Jang | 6,298,274 B1 | 10/2001 | Inoue | |
| 6,097,887 A | 8/2000 | Hardikar et al. | 6,298,470 B1 | 10/2001 | Breiner et al. | |
| 6,100,195 A | 8/2000 | Chan et al. | 6,303,395 B1 | 10/2001 | Nulman | |
| 6,108,092 A | 8/2000 | Sandhu | 6,304,999 B1 | 10/2001 | Toprac et al. | |
| 6,111,634 A | 8/2000 | Pecen et al. | 6,307,628 B1 | 10/2001 | Lu et al. | |
| 6,112,130 A | 8/2000 | Fukuda et al. | 6,314,379 B1 | 11/2001 | Hu et al. | |
| 6,113,462 A | 9/2000 | Yang | 6,317,643 B1 | 11/2001 | Dmochowski | |
| 6,114,238 A | 9/2000 | Liao | 6,320,655 B1 | 11/2001 | Matsushita et al. | |
| 6,127,263 A | 10/2000 | Parikh | 6,324,481 B1 | 11/2001 | Atchison et al. | |
| 6,128,016 A | 10/2000 | Coelho et al. | 6,334,807 B1 | 1/2002 | Lebel et al. | |
| 6,136,163 A | 10/2000 | Cheung et al. | 6,336,841 B1 | 1/2002 | Chang | |
| 6,141,660 A | 10/2000 | Bach et al. | 6,339,727 B1 | 1/2002 | Ladd | |
| 6,143,646 A | 11/2000 | Wetzel | 6,340,602 B1 | 1/2002 | Johnson et al. | |
| 6,148,099 A | 11/2000 | Lee et al. | 6,345,288 B1 | 2/2002 | Reed et al. | |
| 6,148,239 A | 11/2000 | Funk et al. | 6,345,315 B1 | 2/2002 | Mishra | |
| 6,148,246 A | 11/2000 | Kawazome | 6,346,426 B1 | 2/2002 | Toprac et al. | |
| 6,150,270 A | 11/2000 | Matsuda et al. | 6,355,559 B1 | 3/2002 | Havemann et al. | |
| 6,157,864 A | 12/2000 | Schwenke et al. | 6,360,133 B1 | 3/2002 | Campbell et al. | |
| 6,159,075 A | 12/2000 | Zhang | 6,360,184 B1 | 3/2002 | Jacquez | |
| 6,159,644 A | 12/2000 | Satoh et al. | 6,363,294 B1 | 3/2002 | Coronel et al. | |
| 6,161,054 A | 12/2000 | Rosenthal et al. | 6,366,934 B1 | 4/2002 | Cheng et al. | |
| 6,169,931 B1 | 1/2001 | Runnels | 6,368,879 B1 | 4/2002 | Toprac | |
| 6,172,756 B1 | 1/2001 | Chalmers et al. | 6,368,883 B1 | 4/2002 | Bode et al. | |
| 6,173,240 B1 | 1/2001 | Sepulveda et al. | 6,368,884 B1 | 4/2002 | Goodwin et al. | |
| 6,175,777 B1 | 1/2001 | Kim | 6,379,980 B1 | 4/2002 | Toprac | |
| 6,178,390 B1 | 1/2001 | Jun | 6,381,564 B1 | 4/2002 | Davis et al. | |
| 6,181,013 B1 | 1/2001 | Liu et al. | 6,388,253 B1 | 5/2002 | Su | |
| 6,183,345 B1 | 2/2001 | Kamono et al. | 6,389,491 B1 | 5/2002 | Jacobson et al. | |
| 6,185,324 B1 | 2/2001 | Ishihara et al. | 6,391,780 B1 | 5/2002 | Shih et al. | |
| 6,191,864 B1 | 2/2001 | Sandhu | 6,395,152 B1 | 5/2002 | Wang | |
| 6,192,291 B1 | 2/2001 | Kwon | 6,397,114 B1 | 5/2002 | Eryurek et al. | |
| 6,197,604 B1 | 3/2001 | Miller et al. | 6,400,162 B1 | 6/2002 | Mallory et al. | |
| 6,201,208 B1 | 3/2001 | Wendt et al. | 6,405,096 B1 | 6/2002 | Toprac et al. | |
| 6,204,165 B1 | 3/2001 | Ghoshal | 6,405,144 B1 | 6/2002 | Toprac et al. | |
| 6,210,983 B1 | 4/2001 | Atchison et al. | 6,417,014 B1 * | 7/2002 | Lam et al. | 438/14 |
| 6,211,094 B1 | 4/2001 | Jun et al. | 6,427,093 B1 | 7/2002 | Toprac | |
| 6,212,961 B1 | 4/2001 | Dvir | 6,432,728 B1 | 8/2002 | Tai et al. | |
| 6,214,734 B1 | 4/2001 | Bothra et al. | 6,435,952 B1 | 8/2002 | Boyd et al. | |
| 6,217,412 B1 | 4/2001 | Campbell et al. | 6,438,438 B1 | 8/2002 | Takagi et al. | |
| 6,217,658 B1 | 4/2001 | Orczyk et al. | 6,440,295 B1 | 8/2002 | Wang | |
| 6,219,711 B1 | 4/2001 | Chari | 6,442,496 B1 | 8/2002 | Pasadyn et al. | |
| 6,222,936 B1 | 4/2001 | Phan et al. | 6,449,524 B1 | 9/2002 | Miller et al. | |
| 6,226,563 B1 | 5/2001 | Lim | 6,455,415 B1 | 9/2002 | Lopatin et al. | |
| 6,226,792 B1 | 5/2001 | Goiffon et al. | 6,455,937 B1 | 9/2002 | Cunningham | |
| 6,228,280 B1 | 5/2001 | Li et al. | 6,465,263 B1 | 10/2002 | Coss, Jr. et al. | |
| 6,230,069 B1 | 5/2001 | Campbell et al. | 6,470,230 B1 | 10/2002 | Toprac et al. | |
| 6,232,236 B1 | 5/2001 | Shan et al. | 6,479,902 B1 | 11/2002 | Lopatin et al. | |
| 6,236,903 B1 | 5/2001 | Kim et al. | 6,479,990 B2 | 11/2002 | Mednikov et al. | |
| 6,237,050 B1 | 5/2001 | Kim et al. | 6,482,660 B2 | 11/2002 | Conchieri et al. | |
| 6,240,330 B1 | 5/2001 | Kurtzberg et al. | 6,484,064 B1 | 11/2002 | Campbell | |
| 6,240,331 B1 | 5/2001 | Yun | 6,486,492 B1 | 11/2002 | Su | |
| 6,245,581 B1 | 6/2001 | Bonser et al. | 6,492,281 B1 | 12/2002 | Song et al. | |
| 6,246,972 B1 | 6/2001 | Klimasauskas | 6,495,452 B1 | 12/2002 | Shih | |
| 6,248,602 B1 | 6/2001 | Bode et al. | 6,503,839 B2 | 1/2003 | Gonzales et al. | |
| 6,249,712 B1 | 6/2001 | Boiquaye | 6,515,368 B1 | 2/2003 | Lopatin et al. | |
| 6,252,412 B1 | 6/2001 | Talbot et al. | 6,517,413 B1 | 2/2003 | Hu et al. | |
| 6,253,366 B1 | 6/2001 | Mutschler, III | 6,517,414 B1 | 2/2003 | Tobin et al. | |

| | | | | | | |
|---|---|---|---|---|---|---|
| 6,528,409 B1 | 3/2003 | Lopatin et al. | EP | 0 621 522 A2 | 10/1994 | |
| 6,529,789 B1 | 3/2003 | Campbell et al. | EP | 0 747 795 A2 | 12/1996 | |
| 6,532,555 B1 | 3/2003 | Miller et al. | EP | 0 869 652 | 10/1998 | |
| 6,535,783 B1 | 3/2003 | Miller et al. | EP | 0 877 308 A2 | 11/1998 | |
| 6,537,912 B1 | 3/2003 | Agarwal | EP | 0 881 040 A2 | 12/1998 | |
| 6,540,591 B1 | 4/2003 | Pasadyn et al. | EP | 0 895 145 A1 | 2/1999 | |
| 6,541,401 B1 | 4/2003 | Herner et al. | EP | 0 910 123 | 4/1999 | |
| 6,546,508 B1 | 4/2003 | Sonderman et al. | EP | 0 932 194 | 7/1999 | |
| 6,556,881 B1 | 4/2003 | Miller | EP | 0 932 195 A1 | 7/1999 | |
| 6,560,504 B1 | 5/2003 | Goodwin et al. | EP | 1 066 925 A2 | 1/2001 | |
| 6,563,308 B2 | 5/2003 | Nagano et al. | EP | 1 067 757 | 1/2001 | |
| 6,567,717 B2 | 5/2003 | Krivokapic et al. | EP | 1 071 128 | 1/2001 | |
| 6,580,958 B1 | 6/2003 | Takano | EP | 1 083 470 A2 | 3/2001 | |
| 6,587,744 B1 | 7/2003 | Stoddard et al. | EP | 1 092 505 A2 | 4/2001 | |
| 6,590,179 B2 | 7/2003 | Tanaka et al. | EP | 1072967 A3 | 11/2001 | |
| 6,604,012 B1 | 8/2003 | Cho et al. | EP | 1 182 526 A2 | 2/2002 | |
| 6,605,549 B2 | 8/2003 | Leu et al. | GB | 2 347 885 A | 9/2000 | |
| 6,607,976 B2 | 8/2003 | Chen et al. | GB | 2 365 215 A | 2/2002 | |
| 6,609,946 B1 | 8/2003 | Tran | JP | 61-66104 | 4/1986 | |
| 6,616,513 B1 | 9/2003 | Osterheld | JP | 61-171147 | 8/1986 | |
| 6,618,692 B2 | 9/2003 | Takahashi et al. | JP | 01-283934 | 11/1989 | |
| 6,624,075 B1 | 9/2003 | Lopatin et al. | JP | 2050247 | 8/1991 | |
| 6,625,497 B2 | 9/2003 | Fairbairn et al. | JP | 3-202710 | 9/1991 | |
| 6,630,741 B1 | 10/2003 | Lopatin et al. | JP | 05-151231 | 6/1993 | |
| 6,640,151 B1 | 10/2003 | Somekh et al. | JP | 05-216896 | 8/1993 | |
| 6,652,355 B2 | 11/2003 | Wiswesser et al. | JP | 05-266029 | 10/1993 | |
| 6,660,633 B1 | 12/2003 | Lopatin et al. | JP | 06-110894 | 4/1994 | |
| 6,678,570 B1 | 1/2004 | Pasadyn et al. | JP | 06-176994 | 6/1994 | |
| 6,708,074 B1 | 3/2004 | Chi et al. | JP | 06-184434 | 7/1994 | |
| 6,708,075 B2 | 3/2004 | Sonderman et al. | JP | 06-252236 | 9/1994 | |
| 6,725,402 B1 | 4/2004 | Coss, Jr. et al. | JP | 06-260380 | 9/1994 | |
| 6,728,587 B2 * | 4/2004 | Goldman et al. ......... 700/108 | JP | 8-23166 | 1/1996 | |
| 6,735,492 B2 | 5/2004 | Conrad et al. | JP | 08-50161 | 2/1996 | |
| 6,751,518 B1 | 6/2004 | Sonderman et al. | JP | 08-149583 | 6/1996 | |
| 6,774,998 B1 | 8/2004 | Wright et al. | JP | 08-304023 | 11/1996 | |
| 2001/0001755 A1 | 5/2001 | Sandhu et al. | JP | 09-34535 | 2/1997 | |
| 2001/0003084 A1 | 6/2001 | Finarov | JP | 9-246547 | 9/1997 | |
| 2001/0006873 A1 | 7/2001 | Moore | JP | 10-34522 | 2/1998 | |
| 2001/0030366 A1 | 10/2001 | Nakano et al. | JP | 10-173029 | 6/1998 | |
| 2001/0039462 A1 | 11/2001 | Mendez et al. | JP | 11-67853 | 3/1999 | |
| 2001/0040997 A1 | 11/2001 | Tsap et al. | JP | 11-126816 | 5/1999 | |
| 2001/0042690 A1 | 11/2001 | Talieh | JP | 11-135601 | 5/1999 | |
| 2001/0044667 A1 | 11/2001 | Nakano et al. | JP | 2000-183001 | 6/2000 | |
| 2002/0032499 A1 | 3/2002 | Wilson et al. | JP | 2001-76982 | 3/2001 | |
| 2002/0058460 A1 | 5/2002 | Lee et al. | JP | 2001-284299 | 10/2001 | |
| 2002/0070126 A1 | 6/2002 | Sato et al. | JP | 2001-305108 | 10/2001 | |
| 2002/0077031 A1 | 6/2002 | Johansson et al. | JP | 2002-9030 | 1/2002 | |
| 2002/0081951 A1 | 6/2002 | Boyd et al. | JP | 2002-343754 | 11/2002 | |
| 2002/0089676 A1 | 7/2002 | Pecen et al. | TW | 434103 | 5/2001 | |
| 2002/0102853 A1 | 8/2002 | Li et al. | TW | 436383 | 5/2001 | |
| 2002/0107599 A1 | 8/2002 | Patel et al. | TW | 455938 | 9/2001 | |
| 2002/0107604 A1 | 8/2002 | Riley et al. | TW | 455976 | 9/2001 | |
| 2002/0113039 A1 | 8/2002 | Mok et al. | WO | WO 95/34866 | 12/1995 | |
| 2002/0127950 A1 | 9/2002 | Hirose et al. | WO | WO 98/05066 | 2/1998 | |
| 2002/0128805 A1 | 9/2002 | Goldman et al. | WO | WO 98/45090 | 10/1998 | |
| 2002/0149359 A1 | 10/2002 | Crouzen et al. | WO | WO 99/09371 | 2/1999 | |
| 2002/0165636 A1 | 11/2002 | Hasan | WO | WO 99/25520 | 5/1999 | |
| 2002/0183986 A1 | 12/2002 | Stewart et al. | WO | WO 99/59200 | 11/1999 | |
| 2002/0185658 A1 | 12/2002 | Inoue et al. | WO | WO 00/00874 | 1/2000 | |
| 2002/0193899 A1 | 12/2002 | Shanmugasundram et al. | WO | WO 00/05759 | 2/2000 | |
| 2002/0193902 A1 | 12/2002 | Shanmugasundram et al. | WO | WO 00/35063 | 6/2000 | |
| 2002/0197745 A1 | 12/2002 | Shanmugasundram et al. | WO | WO 00/54325 | 9/2000 | |
| 2002/0197934 A1 | 12/2002 | Paik | WO | WO 00/79355 A1 | 12/2000 | |
| 2002/0199082 A1 | 12/2002 | Shanmugasundram et al. | WO | WO 01/11679 | 2/2001 | |
| 2003/0017256 A1 * | 1/2003 | Shimane ................ 427/9 | WO | WO 01/15865 A1 | 3/2001 | |
| 2003/0020909 A1 | 1/2003 | Adams et al. | WO | WO 01/18623 | 3/2001 | |
| 2003/0020928 A1 | 1/2003 | Ritzdorf et al. | WO | WO 01/25865 | 4/2001 | |
| 2003/0154062 A1 | 8/2003 | Daft et al. | WO | WO 01/33277 | 5/2001 | |
| | | | WO | WO 01/33501 A1 | 5/2001 | |
| | FOREIGN PATENT DOCUMENTS | | WO | WO 01/52055 A3 | 7/2001 | |
| EP | 0 397 924 A1 | 11/1990 | WO | WO 01/52319 | 7/2001 | |

| | | |
|---|---|---|
| WO | WO 01/57823 A2 | 8/2001 |
| WO | WO 01/080306 | 10/2001 |
| WO | WO 02/17150 A1 | 2/2002 |
| WO | WO 02/31613 A3 | 4/2002 |
| WO | WO 02/31613 A2 | 4/2002 |
| WO | WO 02/33737 A2 | 4/2002 |
| WO | WO 02/074491 | 9/2002 |

OTHER PUBLICATIONS

Feb. 1984, "Method and Apparatus of in Situ Measurement and Overlay Error Analysis for Correcting Step and Repeat Lithographic Cameras." *IBM Technical Disclosure Bulletin,* pp. 4855–4859.

Oct. 1984. "Method to Characterize the Stability of a Step and Repeat Lithographic System." *IBM Technical Disclosure Bulletin,* pp. 2857–2860.

Runyan, W. R., and K. E. Bean. 1990. "Semiconductor Integrated Circuit Processing Technology." p. 48. Reading, Massachusetts: Addison–Wesley Publishing Company.

Zorich, Robert. 1991. *Handbook of Quality Integrated Circuit Manufacturing.* pp. 464–498 San Diego, California: Academic Press, Inc.

Rampalli, Prasad, Arakere Ramesh, and Nimish Shah. 1991. *CEPT—A Computer–Aided Manufacturing Application for Managing Equipment Reliability and Availability in the Semiconductor Industry.* New York, New York: IEEE.

Moyne, James R., Nauman Chaudhry, and Roland Telfeyan. 1995. "Adaptive Extensions to a Multi–Branch Run–to–Run Controller for Plasma Etching." *Journal of Vacuum Science and Technology.* Ann Arbor, Michigan: University of Michigan Display Technology Manufacturing Center.

Moyne, James, Roland Telfeyan, Arnon Hurwitz, and John Taylor. Aug. 1995. "A Process–Independent Run–to–Run Controller and Its Application to Chemical–Mechanical Planarization." *SEMI/IEEE Advanced Semiconductor Manufacturing Conference and Workshop.* Ann Arbor, Michigan: The University of Michigan, Electrical Engineering & Computer Science Center and Display Technology & Manufacturing.

Zhou, Zhen–Hong and Rafael Reif. Aug. 1995. "Epi–Film Thickness Measurements Using Emission Fourier Transform Infrared Spectroscopy—Part II: Real–Time in Situ Process Monitoring and Control." IEEE Transactions on Semiconductor Manufacturing, vol. 8, No. 3.

Telfeyan, Roland, James Moyne, Nauman Chadhry, James Pugmire, Scott Shellman, Duane Boning, William Moyne, Arnon Hurwitz, and John Taylor. Oct. 1995. "A Multi–Level Approach to the Control of a Chemical–Mechanical Planarization Process." Minneapolis, Minnesota: $42^{nd}$ National Symposium of the American Vacuum Society.

Chang, E., B. Stine, T. Maung, R. Divecha, D. Boning, J. Chung, K. Chang, G. Ray, D. Bradbury, O. S. Nakagawa, S. Oh, and D. Bartelink, Dec. 1995. "Using a Statistical Metrology Framework to Identify Systematic and Random Sources of Die– and Wafer–level ILD Thickness Variation in CMP Processes." Washington, D.C.: International Electron Devices Meeting.

Schmid, Hans Albrecht. 1995. "Creating the Architecture of a Manufacturing Framework by Design Patterns." Austin, Texas: OOPSLA.

Dishon, G., M. Finarov, R. Kipper, J.W. Curry, T. Schraub, D. Trojan, $4^{th}$ Stambaugh, Y. Li and J. Ben–Jacob. Feb. 1996. "On–Line Integrated Metrology for CMP Processing." Santa Clara, California: VMIC Speciality Conferences, $1^{st}$ International CMP Planarization Conference.

Smith, Taber, Duane Boning, James Moyne, Arnon Hurwitz, and John Curry. Jun. 1996. "Compensating for CMP Pad Wear Using Run by Run Feedback Control." Santa Clara, California. VLSI Multilevel Interconnect Conference.

Boning, Duane, William Moyne, Taber Smith, James Moyne, Roland Telfeyan, Arnon Hurwitz, Scott Shellman, and John Taylor. Oct. 1996. "Run by Run Control of Chemical–Mechanical Polishing." *IEEE Trans. CPMT (C),* vol. 19, No. 4, pp. 307–314.

SEMI. [1986] 1996. "Standard for Definition and Measurement of Equipment Reliability, Availability, and Maintainability (RAM)." SEMI E10–96.

U.S. patent application Ser. No. 09/363,966, filed Jul. 29, 1999, Arackaparambil et al., Computer Integrated Manufacturing Techniques.

U.S. patent application Ser. No. 09/469,227, filed Dec. 22, 1999, Somekh et al., Multi–Tool Control System, Method and Medium.

U.S. patent application Ser. No. 09/619,044, filed Jul. 19, 2000, Yuan, System and Method of Exporting or Importing Object Data in a Manufacturing Execution System.

U.S. patent application Ser. No. 09/637,620, filed Aug. 11, 2000, Chi et al., Generic Interface Builder.

U.S. patent application Ser. No. 09/656,031, filed Sep. 6, 2000, Chi et al., Dispatching Component for Associating Manufacturing Facility Service Requestors with Service Providers.

U.S. patent application Ser. No. 09/655,542, filed Sep. 6, 2000, Yuan, System, Method and Medium for Defining Palettes to Transform an Application Program Interface for a Service.

Van Zant, Peter. 1997. *Microchip Fabrication: A Practical Guide to Semiconductor Processing.* Third Edition, pp. 472–478. New York, New York: McGraw–Hill.

Campbell, W. Jarrett, and Anthony J. Toprac. Feb. 11–12, 1998. "Run–to–Run Control in Microelectronics Manufacturing." Advanced Micro Devises, TWMCC.

Edgar, Thomas F., Stephanie W. Butler, Jarrett Campbell, Carlos Pfeiffer, Chris Bode, Sung Bo Hwang, and K.S. Balakrishnan. May 1998. "Automatic Control in Microelectronics Manufacturing: Practices, Challenges, and Possibilities." Automatica, vol. 36, pp. 1567–1603, 2000.

Moyne, James, and John Curry. Jun. 1998. "A Fully Automated Chemical–Mechanical Planarization Process." Santa Clara, California: VLSI Multilevel Interconnection (V–MIC) Conference.

SEMI. Jul. 1998. *New Standard: Provisional Specification for CIM Framework Domain Architecture.* Mountain View, California: SEMI Standards. SEMI Draft Doc. 2817.

Consilium. Aug. 1998. *Quality Management Component: QMC™ and QMC–Link™ Overview.* Mountain View, California: Consilium, Inc.

U.S. patent application Ser. No. 09/725,908, filed Nov. 30, 2000, Chi et al., Dynamic Subject Information Generation in Message Services of Distributed Object Systems.

U.S. patent application Ser. No. 09/800,980, filed Mar. 8, 2001, Hawkins et al., Dynamic and Extensible Task Guide.

U.S. patent application Ser. No. 09/811,667, filed Mar. 20, 2001, Yuan et al., Fault Tolerant and Automated Computer Software Workflow.

U.S. patent application Ser. No. 09/927,444, filed Aug. 13, 2001, Ward et al., Dynamic Control of Wafer Processing Paths in Semiconductor Manufacturing Processes.

U.S. patent application Ser. No. 09/928,473, filed Aug. 14, 2001, Koh, Tool Services Layer for Providing Tool Service Functions in Conjunction with Tool Functions.

U.S. patent application Ser. No. 09/928,474, Aug. 14, 2001, Krishnamurthy et al., Experiment Management System, Method and Medium.

Chemali, Chadi El, James Moyne, Kareemullah Khan, Rock Nadeau, Paul Smith, John Colt, Jonathan Chapple–Sokol, and Tarun Parikh. Nov. 1998. "Multizone Uniformity Control of a CMP Process Utilizing a Pre and Post–Measurement Strategy." Seattle, Washington: SEMETECH Symposium.

Consilium. 1998. *FAB300™* . Mountain View, California: Consilium, Inc.

Khan, Kareemullah, Victor Solakhain, Anthony Ricci, Tier Gu, and James Moyne. 1998. "Run–to–Run Control of ITO Deposition Process." Ann Arbor, Michigan.

Consilium. Jan. 1999. Jan. 1999. "FAB300™: Consilium's Next Generation MES Solution of Software and Services which Control and Automate Real–Time FAB Operations." www.consilium.com/products/fab300_page.htm#FAB300 Introduction.

Baliga, John. Jul. 1999. "Advanced Process Control: Soon to be a Must." Cahners Semiconductor International. www.semiconductor.net/semiconductor/issues/issues/1999/jul99/docs/feature1.asp.

Consilium Jul. 1999. "Increasing Overall Equipment Effectiveness (OEE) in Fab Manufacturing by Implementing Consilium's Next–Generation Manufacturing Execution System—MES II." Semiconductor Fabtech Edition 10.

Consilium Corporate Brochure. Oct. 1999. www.consilium.com.

U.S. patent application Ser. No. 09/943,383, filed Aug. 31, 2001, Shanmugasundram et al., In Situ Based Control of Semiconductor Processing Procedure.

U.S. patent application Ser. No. 09/943,955, filed Aug. 31, 2001, Shanmugasundram et al., Feedback Control of a Chemical Mechanical Polishing Device Providing Manipulation of Removal Rate Profiles.

U.S. patent application Ser. No. 09/998,372, filed Nov. 30, 2001, Paik, Control of Chemical Mechanical Polishing Pad Conditioner Directional Velocity to Improve Pad Life.

U.S. patent application Ser. No. 09/998,384, filed Nov. 30, 2001, Paik, Feedforward and Feedback Control for Conditioning of Chemical Mechanical Polishing Pad.

U.S. patent application Ser. No. 10/084,092, filed Feb. 28, 2002, Arackaparambil et al., Computer Integrated Manufacturing Techniques.

U.S. patent application Ser. No. 10/100,184, filed Mar. 19, 2002, Al–Bayati et al., Method, System and Medium for Controlling Semiconductor Wafer Processes Using Critical Dimension Measuremens.

Moyne, James. Oct. 1999. "Advancement in CMP Process Automation and Control." Hawaii: (Invited paper and presentation to) Third International Symposium on Chemical Mechanical Polishing in IC Device Manufacturing: 196th Meeting of the Electrochemical Society.

Consilium. Nov. 1999. *FAB300™ Update*.

SEMI. 2000. "Provisional Specification for CIM Framework Scheduling Component." San. Jose, California. SEMI E105–1000.

Lee, Brian, Duane S. Boning, Winthrop Baylies, Noel Poduje, Pat Hester, Yong Xia, John Valley, Chris Koliopoulus, Dale Hetherington, HongJiang Sun, and Michael Lacy. Apr. 2001. "Wafer Nanotopography Effects on CMP: Experimental Validation of Modeling Methods." San Francisco, California: Materials Research Society Spring Meeting.

Jul. 5, 2001. "Motorola and Advanced Micro Devices Buy ObjectSpace Catalyst Advanced Process Control Product for Five Wafer Fabs." Semiconductor FABTECH. www.semiconductorfabtech.com/industry.news/9907/20.07.shtml.

U.S. patent application Ser. No. 10/135,405, filed May 1, 2002, Reiss et al., Integration of Fault Detection with Run–to–Run Control.

U.S. patent application Ser. No. 10/135,451, filed May 1, 2002, Shanmugasundram et al., Dynamic Metrology Schemes and Sampling Schemes for Advanced Process Control in Semiconductor Processing.

U.S. patent application Ser. No. 10/172,977, filed Jun. 18, 2002, Shanmugasundram et al., Method, System and Medium for Process Control for the Matching of Tools, Chambers and/or Other Semiconductor–Related Entities.

U.S. patent application Ser. No. 10/173,108, filed Jun. 18, 2002, Shanmugasundram et al., Integrating Tool, Module, and Fab Level Control.

U.S. patent application Ser. No. 10/174,377, filed Jun. 18, 2002, Schwarm et al., Feedback Control of Sub–Atmospheric Chemical Vapor Deposition Processes.

Oct. 15, 2001. Search Report prepared by the Austrian Patent Office for Singapore Patent Application No. 200004286–1.

NovaScan 2020. Feb. 2002. "Superior Integrated Process Control for Emerging CMP High–End Applications."

Johnson, Bob. Jun. 10, 2002. "Advanced Process Control Key to Moore's Law." Gartner, Inc.

Jul. 9, 2002. International Search Report prepared by the European Patent Office for PCT/US01/24910.

Jul. 29, 2002. International Search Report prepared by the European Patent Office for PCT/US01/27407.

Sonderman, Thomas. 2002. "APC as a Competitive Manufacturing Technology: *AMD's Vision for 300mm.*" AEC/APC.

Jul. 23, 2002. Communication Pursuant to Article 96(2) EPC for European Patent Application No. 00 115 577.9.

Oct. 15, 2002. International Search Report prepared by the European Patent Office for PCT/US02/19062.

Hu, Albert, Kevin Nguyen, Steve Wong, Xiuhua Zhang, Emanuel Sachs, and Peter Renteln. 1993. "Concurrent Deployment of Run by Run Controller Using SCC Framework." IEEE/SEMI International Semiconductor Manufacturing Science Symposium. pp. 126–132.

Hu, Albert, He Du, Steve Wong, Peter Renteln, and Emanuel Sachs. 1994. "Application of Run by Run Controller to the Chemical–Mechanical Planarization Process." IEEE/CPMT International Electronics Manufacturing Technology Symposium. pp. 371–378.

Smith, Taber, Duane Boning, James Moyne, Arnon Hurwitz, and John Curry. Jun. 1996. "Compensating for CMP Pad Wear Using Run by Run Feedback Control." Proceedings of the Thirteenth International VLSI Multilevel Interconnection Conference. pp. 437–439.

Suzuki, Junichi and Yoshikazu Yamamoto. 1998. "Toward the Interoperable Software Design Models: Quartet of UML, XML, DOM and COBRA." Proceedings IEEE International Software Engineering Standards Symposium. pp. 1–10.

Klein, Bruce. Jun. 1999. "Application Development: XML Makes Object Models More Useful." Informationweek. pp. 1A–6A.

Chemali, Chadi El, James Moyne, Kareemullah Khan, Rock Nadeau, Paul Smith, John Colt, Jonathan Chapple–Sokol, and Tarun Parikh. Jul./Aug. 2000. "Multizone Uniformity Control of a Chemical Mechanical Polishing Process Utilzing a Pre– and Postmeasurement Strategy." J. Vac. Sci. Technol. A, vol. 18(4). pp. 1287–1296. American Vacuum Society.

Jensen, Alan, Peter Renteln, Stephen Jew, Chris Raeder, and Patrick Cheung. Jun. 2001. "Empirical–Based Modeling for Control of CMP Removal Uniformity." Solid State Technology, vol. 44, No. 6, pp. 101–102, 104, 106. Cowan Publ. Corp.: Washington, D.C.

Sarfaty, Moshe, Arulkumar Shanmugasundram, Alexander Schwarm, Joseph Paik, Jimin Zhang, Rong Pan, Martin J. Seamons, Howard Li, Raymond Hung, and Suketu Parikh. Apr./May 2002. "Advance Process Control Solutions for Semiconductor Manufacturing." IEEE/SEMI Advanced Semiconductor Manufacturing Conference. pp. 101–106.

Oct. 4, 2002. International Search Report from PCT/US01/22833.

Oct. 23, 2002. International Search Report from PCT/US01/27406.

Nov. 7, 2002. International Search Report from PCT/US02/19061.

Nov. 11, 2002. International Search Report from PCT/US02/19117.

Nov. 12, 2002. International Search Report from PCT/US02/19063.

Ostanin, Yu.Ya. Oct. 1981. "Optimization of Thickness Inspection of Electrically Conductive Single–Layer Coatings with Laid–on Eddy–Current Transducers (Abstract)." *Defektoskopiya*, vol. 17, No. 10, pp. 45–52. Moscow USSR.

Feb. 1984. "Substrate Screening Process." *IBM Technical Disclosure Bulleting*, pp. 4824–4825.

Herrmann, D. 1988. "Temperature Errors and Ways of Elimination for Contactless Measurement of Shaft Vibrations (Abstract)." *Technisches Messen™*, vol. 55, No. 1, pp. 27–30. West Germany.

Lin, Kuang–Kuo and Costas J. Spanos. Nov. 1990. "Statistical Equipment Modeling for VLSI Manufacturing: An Application for LPCVD." *IEEE Transactions on Semiconductor Manufacturing*, v. 3, n. 4, pp. 216–229.

Chang, Norman H. and Costas J. Spanos. Feb. 1991. "Continuous Equipment Diagnosis Using Evidence Integration: An LPCVD Application." *IEEE Transactions on Semiconductor Manufacturing*, v. 4, n. 1, pp. 43–51.

Larrabee, G. B. May 1991. "The Intelligent Microelectronics Factory of the Future (Abstract)." *IEEE/SEMI International Semiconductor Manufacturing Science Symposium*, pp. 30–34. Burlingame, CA.

Burke, Peter A. Jun. 1991. "Semi–Empirical Modelling of SiO2 Chemical–Mechanical Polishing Planarization." *VMIC Conference, 1991 IEEE*, pp. 379–384. IEEE.

May 1992. "Laser Ablation Endpoint Detector." *IBM Technical Disclosure Bulletin*, pp. 333–334.

Spanos, Costas J., Hai–Fang Guo, Alan Miller, and Joanne Levine–Parrill. Nov. 1992. "Real–Time Statistical Process Control Using Tool Data." *IEEE Transactions on Semiconductor Manufacturing*, v. 5, n. 4, pp. 308–318.

Feb. 1993. "Electroless Plating Scheme to Hermetically Seal Copper Features." *IBM Technical Disclosure Bulletin*, pp. 405–406.

Scarr, J. M. and J. K. Zelisse, Apr. 1993. "New Topology for Thickness Monitoring Eddy Current Sensors (Abstract)." *Proceedings of the 36th Annual Technical Conference*, Dallas, Texas.

Matsuyama, Akira and Jessi Niou. 1993. "A State–of–the–Art Automation System of an ASIC Wafer Fab in Japan." *IEEE/SEMI International Semiconductor Manufacturing Science Symposium*, pp. 42–47.

Yeh, C. Eugene, John C. Cheng, and Kwan Wong. 1993. "Implementation Challenges of a Feedback Control System for Wafer Fabrication." *IEEE/CHMT International Electronics Manufacturing Technology Symposium*, pp. 438–442.

Kurtzberg, Jerome M. and Menachem Levanoni. Jan. 1994. "ABC: A Better Control for Manufacturing." *IBM Journal of Research and Development*, v. 38, n. 1, pp. 11–30.

Mozumder, Purnendu K. and Gabriel G. Barna. Feb. 1994. "Statistical Feedback Control of a Plasma Etch Process." *IEEE Transactions on Semiconductor Manufacturing*, v. 7, n. 1, pp. 1–11.

Muller–Heinzerling, Thomas, Ulrich Neu, Hans Georg Nurnberg, and Wolfgang May. Mar. 1994. "Recipe–Controlled Operation of Batch Processes with Batch X." *ATP Automatisierungstechnische Praxis*, vol. 36, No. 3, pp. 43–51.

Stoddard, K., P. Crouch, M. Kozicki, and K. Tsakalis. Jun.–Jul. 1994. "Application of Feedforward and Adaptive Feedback Control to Semiconductor Device Manufacturing (Abstract)." *Proceedings of 1994 American Control Conference—ACC '94*, vol. 1, pp. 892–896. Baltimore, Maryland.

Schaper, C. D., M. M. Moslehi, K. C. Saraswat, and T. Kailath. Nov. 1994. "Modeling, Identification, and Control of Rapid Thermal Processing Systems (Abstract)." *Journal of the Electrochemical Society*, vol. 141, No. 11, pp. 3200–3209.

Tao, K. M., R. L. Kosut, M. Ekblad, and G. Aral. Dec. 1994. "Feedforward Learning Applied to RTP of Semiconductor Wafers (Abstract)." *Proceedings of the 33rd IEEE Conference on Decision and Control*, vol. 1, pp. 67–72. Lake Buena Vista, Florida.

Hu, Albert, He Du, Steve Wong, Peter Renteln, and Emmanuel Sachs. 1994. "Application of Run by Run Controller to the Chemical–Mechanical Planarization Process." *IEEE/CPMT International Electronics Manufacturing Technology Symposium*, pp. 371–378.

Spanos, C. J., S. Leang, S.–Y. Ma, J. Thomson, B. Bombay, and X. Niu. May 1995. "A Multistep Supervisory Controller for Photolithographic Operations (Abstract)." *Proceedings of the Symposium on Process Control, Diagnostics, and Modeling in Semiconductor Manufacturing*, pp. 3–17.

Leang, Sovarong, Shang–Yi Ma, John Thomson, Bart John Bombay, and Costas J. Spanos. May 1996. "A Control System for Photolithographic Sequences." *IEEE Transactions on Semiconductor Manufacturing*, vol. 9. No. 2.

Boning, Duane S., William P. Moyne, Taber H. Smith, James Moyne, Ronald Telfeyan, Arnon Hurwitz, Scott Shellman, and John Taylor. Oct. 1996. "Run by Run Control of Chemical–Mechanical Polishing." *IEEE Transactions on Components, Packaging, and Manufacturing Technology—Part C*, vol. 19, No. 4, pp. 307–314.

Zhe, Ning, J. R. Moyne, T. Smith, D. Boning, E. Del Castillo, Yeh Jinn–Yi, and Hurwitz. Nov. 1996. "A Comparative Analysis of Run–to–Run Control Algorithms in Semiconductor Manufacturing Industry (Abstract)." *IEEE/SEMI 1996 Advanced Semiconductor Manufacturing Conference Workshop*, pp. 375–381.

Yasuda, M., T. Osaka, and M. Ikeda. Dec. 1996. "Feedforward Control of a Vibration Isolation System for Disturbance Suppression (Abstract)." *Proceeding of the 35th IEEE Conference on Decision and Control*, vol. 2, pp. 1229–1233. Kobe, Japan.

Fan, Jr–Min, Ruey–Shan Guo, Shi–Chung Chang, and Kian–Huei Lee. 1996. "Abnormal Tred Detection of Sequence–Disordered Data Using EWMA Method." *IEEE/SEMI Advanced Semiconductor Manufacturing Conference*, pp. 169–174.

Smith, Taber and Duane Boning. 1996. "A Self–Tuning EWMA Controller Utilizing Artificial Neural Network Function Approximation Techniques." *IEEE/CPMT International Electronics Manufacturing Technology Symposium*, pp. 355–363.

Guo, Ruey–Shan, Li–Shia Huang, Argon Chen, and Jin–Jung Chen. Oct. 1997. "A Cost–Effective Methodology for a Run–by–Run EWMA Controller." *6th International Symposium on Semiconductor Manufacturing*, pp. 61–64.

Mullins, J. A., W. J. Campbell, and A. D. Stock. Oct. 1997. "An Evaluation of Model Predictive Control in Run–to–Run Processing in Semiconductor Manufacturing (Abstract)." *Proceedings of the SPIE—The International Society for Optical Engineering Conference*, vol. 3213, pp. 182–189.

Reitman, E. A., D. J. Friedman, and E. R. Lory. Nov. 1997. "Pre–Production Results Demonstrating Multiple–System Models for Yield Analysis (Abstract)." *IEEE Transactions on Semiconductor Manufacturing*, vol. 10, No. 4, pp. 469–481.

Durham, Jim and Myriam Roussel. 1997. "A Statistical Method for Correlating In–Line Defectivity to Probe Yield." *IEEE/SEMI Advanced Semiconductor Manufacturing Conference*, pp. 76–77.

Shindo, Wataru, Eric H. Wang, Ram Akella, and Andrzej J. Strojwas. 1997. "Excursion Detection and Source Isolation in Defect Inspection and Classification." *2nd International Workshop on Statistical Metrology*, pp. 90–93.

Jul. 1998. "Active Controller: Utilizing Active Databases for Implementing Multistep Control of Semiconductor Manufacturing (Abstract)." *IEEE Transactions on Components, Packaging and Manufacturing Technology—Part C*, vol. 21, No. 3, pp. 217–224.

Fang, S. J., A. Barda, T. Janecko, W. Little, D. Outley, G. Hempel, S. Joshi, B. Morrison, G. B. Shinn, and M. Birang. 1998. "Control of Dielectric Chemical Mechanical Polishing (CMP)Using and Interferometry Based Endpoint Sensor." *International Proceedings of the IEEE Interconnect Technology Conference*, pp. 76–78.

Ouma, Dennis, Duane Boning, James Chung, Greg Shinn, Leif Olsen, and John Clark. 1998. "An Integrated Characterization and Modeling Methodology for CMP Dielectric Planarization". *Proceedings of the IEEE 1998 International Interconnect Technology Conference*, pp. 67–69.

Boning, Duane S., Jerry Stefani, and Stephanie W. Butler, Feb. 1999. "Statistical Methods for Semiconductor Manufacturing." *Encyclopedia of Electrical Engineering, J. G. Webster, Ed.*

McIntosh, John. Mar. 1999. "Using CD–SEM Metrology in the Manufacture of Semiconductors (Abstract)." *JOM*, vol 51, No. 3, pp. 38–39.

Pan, J. Tony, Ping Li, Kapila Wijekoon, Stan Tsai, and Fritz Redeker. May 1999. "Copper CMP Integration and Time Dependent Pattern Effect." *IEEE 1999 International Interconnect Technology Conference*, pp. 164–166.

Meckl, P. H. and K. Umemoto. Aug. 1999. "Achieving Fast Motions in Semiconductor Manufacturing Machinery (Abstract)." *Proceedings of the 1999 IEEE International Conference on Control Applications*, vol. 1, pp. 725–729. Kohala Coast, HI.

Khan, K., C. El Chemali, J. Moyne, J. Chapple–Sokol, R. Nadeau, P. Smith, C., and T. Parikh. Oct. 1999, "Yield Improvement at the Contact Process Through Run–to–Run Control (Abstract)." *24th IEEE/CPMT Electronics Manufacturing Technology Symposium*, pp. 258–263.

Ruegsgger, Steven, Aaron Wagner, James S. Freudenberg, and Dennis S. Grimard. Nov. 1999. "Feedforward Control for Reduced Run–to–Run Variation in Microelectronics Manufacturing." *IEEE Transactions on Semiconductor Manufacturing*, vol. 12, No. 4.

Nov. 1999. "How to Use EWMA to Achieve SPC and EPC Control." *International Symposium on NDT Contribution to the Infrastructure Safety Systems*, Tores, Brazil. <http://www.ndt.net/abstract/ndtiss99/data/35.htm>.

Edgar, T. F., W. J. Campbell, and C. Bode. Dec. 1999. "Model–Based Control in Microelectronics Manufacturing." *Proceedings of the 38th IEEE Conference on Decision and Control*, Phoenix, Arizona, vol. 4, pp. 4185–4191.

Meckl, P. H. and K. Umemoto. Apr. 2000. "Achieving Fast Motions by Using Shaped Reference Inputs [Semiconductor Manufacturing Machine] (Abstract)." *NEC Research and Development*, vol. 41, No. 2, pp. 232–237.

Oechsner, R., T. Tschaftary, S. Sommer, L. Pfitzner, H. Ryssel, H. Gerath, C. Baier, and M. Hafner. Sep. 2000. "Feed–forward Control for a Lithography/Etch Sequence (Abstract)." *Proceedings of the SPIE—The International Society for Optical Engineering Conference*, vol. 4182, pp. 31–39.

Cheung, Robin. Oct. 18, 2000. "Copper Interconnect Technology." *AVS/CMP User Group Meeting*, Santa Clara, CA.

Edgar, Thomas F., Stephanie W. Butler, W. Jarrett Campbell, Carlos Pfeiffer, Christopher Bode, Sung Bo Hwang, K. S. Balakrishnan, and J. Hahn. Nov. 2000. "Automatic Control in Microelectronics Manufacturing: Practices, Challenges, and Possibilities (Abstract)." *Automatica*, v. 36, n. 11.

Khan, S., M. Musavi, and H. Ressom. Nov. 2000. "Critical Dimension Control in Semiconductor Manufacturing (Abstract)." *ANNIE 2000. Smart Engineering Systems Design Conference*, pp. 995–1000. St. Louis, Missouri.

ACM Research Inc. 2000. "Advanced Copper Metallization for 0.13 to 0.05 $\mu$m & Beyond." <http://acmrc.com/press/ACM–ECP–brochure.pdf>.

Ravid, Avi, Avner Sharon, Amit Weingarten, Vladimir Machavariani, and David Scheiner. 2000. "Copper CMP Planarity Control Using ITM." *IEEE/SEMI Advanced Semiconductor Manufacturing Conference*, pp. 437–443.

Chen, Argon and Ruey–Shan Guo. Feb. 2001. "Age–Based Double EWMA Controller and Its Application to CMP Processes." *IEEE Transactions on Semiconductor Manufacturing*, vol. 14, No. 1, pp. 11–19.

Tobin, K. W., T. P. Karnowski, L. F. Arrowood, and F. Lakhani. Apr. 2001. "Field Test Results of an Automated Image Retrieval System (Abstract)." *Advanced Semiconductor Manufacturing Conference, 2001 IEEE/SEMI*, Munich, Germany.

Tan, K. K., H. F. Dou, and K. Z. Tang. May–Jun. 2001. "Precision Motion Control System for Ultra–Precision Semiconductor and Electronic Components Manufacturing (Abstract)." $51^{st}$ *Electronic Components and Technology Conference 2001. Proceedings*, pp. 1372–1379. Orlando, Florida.

Heuberger, U. Sep. 2001. "Coating Thickness Measurement with Dual–Function Eddy–Current & Magnetic Inductance Instrument (Abstract)." *Galvanotechnik*, vol. 92, No. 9, pp. 2354–2366+IV.

Wang, LiRen and Hefin Rowlands. 2001. "A Novel NN–Fuzzy–SPC Feedback Control System." $8^{th}$ *IEEE International Conference on Emerging Technologies and Factory Automation*, pp. 417–423.

Moyne, J., V. Solakhian, A. Yershov, M. Anderson, and D. Mockler–Hebert. Apr.–May 2002. "Development and Deployment of a Multi–Component Advanced Process Control System for an Epitaxy Tool (Abstract)." *2002 IEEE Advanced Semiconductor Manufacturing Conference and Workshop*, pp. 125–130.

Sarfaty, M., A. Shanmugasundram, A. Schwarm, J. Paik, Jimin Zhang, Rong Pan, M. J. Seamons, H. Li, R. Hung, and S. Parikh. Apr.–May 2002. "Advance Process Control Solutions for Semiconductor Manufacturing (Abstract)." $13^{th}$ *Annual IEEE/SEMI Advanced Semiconductor Manufacturing Conference. Advancing the Science and Technology of Semiconductor Manufacturing. ASMC 2002*, pp. 101–106. Boston, MA.

Campbell, W. J., S. K. Firth, A. J. Toprac, and T. F. Edgar. May 2002. "A Comparison of Run–to–Run Control Algorithms (Abstract)." *Proceedings of 2002 American Control Conference*, vol. 3, pp. 2150–2155.

Good, Richard and S. Joe Qin. May 2002. "Stability Analysis of Double EWMA Run–to–Run Control with Metrology Delay." *IEEE/CPMT International Electronics Manufacturing Technology Symposium*, pp. 355–363.

Smith, Stewart, Anthony J. Walton, Alan W. S. Ross, Georg K. H. Bodammer, and J. T. M. Stevenson. May 2002. "Evaluation of Sheet Resistance and Electrical Linewidth Measurement Techniques for Copper Damascene Interconnect." *IEEE Transactions on Semiconductor Manufacturing*, vol. 15, No. 2, pp. 214–222.

Itabashi, Takeyuki, Hiroshi Nakano, and Haruo Akahoshi. Jun. 2002. "Electroless Deposited CoWB for Copper Diffusion Barrier Metal." *IEEE International Interconnect Technology Conference*, pp. 285–287.

ACM Research, Inc. 2002. "ACM Ultra ECP® System: Electro–Copper Plating (ECP) Deposition." www.acmrc.com/ecp.html.

Applied Materials, Inc. 2002. "Applied Materials: Information for Everyone: Copper Electrochemical Plating." www.appliedmaterials.com/products/copper_electrochemical_plating.html.

KLA–Tencor Corporation. 2002. "KLA Tencor: Press Release: KLA–Tencor Introduces First Production–Worthy Copper CMP In–Situ Film Thickness and End–point Control System: Multi–Million Dollar Order Shipped to Major CMP Tool Manufacturer." www.kla–tencor.com/news_events/press_releases/press_releases2001/984086002.html.

Takahashi, Shingo, Kaori Tai, Hiizu Ohtorii, Naoki Komai, Yuji Segawa, Hiroshi Horikoshi, Zenya Yasuda, Hiroshi Yamada, Masao Ishihara, and Takeshi Nogami. 2002. "Fragile Porous Low–k/Copper Integration by Using Electro–Chemical Polishing." *2002 Symposium on VLSI Technology Digest of Technical Papers*, pp. 32–33.

Cunningham, James A. 2003. "Using Electrochemistry to Improve Copper Interconnects." <http://www.e–insite.net/semiconductor/index.asp?layout=article&articleid=CA47465>.

Mar. 25, 2003. International Search Report for PCT/US02/24859 prepared by the European Patent Office.

Adams, Bret W., Bogdan Swedek, Rajeev Bajaj, Fritz Redeker, Manush Birang, and Gregory Amico. "Full–Wafer Endpoint Detection Improves Process Control in Copper CMP." *Semiconductor Fabtech*—$12^{th}$ Edition. Applied Materials, Inc., Santa Clara, CA.

Berman, Mike, Thomas Bibby, and Alan Smith. "Review of In Situ & In–line Detection for CMP Applications." *Semiconductor Fabtech*, $8^{th}$ Edition, pp. 267–274.

"Semiconductor Manufacturing: An Overview." <http://users.ece.gatech.edu/~gmay/overview.html> 2003.

Levine, Martin D. 1985. *Vision in Man and Machine*. New York: McGraw–Hill, Inc. pp. ix–xii, 1–58.

Pilu, Maurizio. Sep. 2001. "Undoing Page Curl Distortion Using Applicable Surfaces." *IEEE International Conference on Image Processing*. Thessalonica, Greece.

May 23, 2003. Written Opinion for PCT/US01/24910.

Williams, Randy, Dadi Gudmundsson, Kevin Monahan, Raman Nurani, Meryl Stoller and J. George Shanthikumar. Oct. 1999. "Optimized Sample Planning for Wafer Defect Inspection," *Semiconductor Manufacturing Conference Proceedings, 1999 IEEE International Symposium on Santa Clara, CA*. Piscataway, NJ. pp. 43 –46.

Jul. 23, 2003. Invitation to Pay Additional Fees and Communication Relating to the Results of the Partial International Search for PCT/US02/19116.

Aug. 1, 2003. Written Opinion for PCT/US01/27406.

Aug. 20, 2003. Written Opinion for PCT/US01/22833.

Miller, G. L., D. A. H. Robinson, and J. D. Wiley, Jul. 1976. "Contactless measurement of semiconductor conductivity by radio frequency–free–carrier power absorption." *Rev. Sci. Instrum.*, vol. 47, No. 7. pp. 799 –805.

1999. "Contactless Bulk Resistivity/Sheet Resistance Measurement and Mapping Systems." www.Lehighton.com/fabtech1/index.html.

2000. "Microsense II Capacitance Gaging System." www.a-detech.com.

El Chemali, Chadi et al. Jul./Aug. 2000. "Multizone uniformity control of a chemical mechanical polishing process utilizing a pre– and postmeasurement strategy." *J. Vac. Sci. Technol.* vol. 18, No. 4. pp. 1287 –1296.

Mar. 5, 2001. "KLA–Tencor Introduces First Production–worthy Copper CMP In–situ Film Thickness and End–point Control System." http://www.kla–tencor.com/j/servlet/NewsItem?newsItemID=74.

2002. "Microsense II—5810: Non–Contact Capacitance Gaging Module." www.adetech.com.

Aug. 8, 2003. PCT International Search Report from PCT/US03/08513.

Oct. 14, 2003. PCT International Search Report from PCT/US02/21942.

Oct. 20, 2003. PCT International Search Report from PCT/US02/19116.

Oct. 23, 2003. PCT International Preliminary Examination Report from PCT/US01/24910.

"NanoMapper wafer nanotopography measurement by ADE Phase Shift." http://www.phase–shift.com/nanomap.shtml, 2003.

"Wafer flatness measurement of advanced wafers." http://www.phase–shift.com/wafer–flatness.shtml, (2003).

"ADE Technologies, Inc.—6360." http://www.adetech.com/6360.shtml, (2003).

"3D optical profilometer MicroXAM by ADE Phase Shift." http://www.phase–shift.com/microxam.shtml. 2003.

"NanoMapper FA factory automation wafer nanotopography measurement." http://www.phase–shift.com/nanomapperfa.shtml, 2003.

Rocha, Joao and Carlos Ramos. Sep. 12, 1994. "Task Planning for Flexible and Agile Manufacturing Systems." *Intelligent Robots and Systems '94. Advanced Robotic Systems and the Real World, IROS '94. Proceedings of the IEEE/RSJ/GI International Conference on Munich, Germany Sep. 12–16, 1994*. New York, New York: IEEE. pp. 105–112.

Mar. 15, 2002. Office Action for U.S. patent application Ser. No. 09/469,227, filed Dec. 22, 1999.

Mar. 29, 2002. Office Action for U.S. patent application Ser. No. 09/363,966, filed Jul. 29, 1999.

Jun. 20, 2002. Office Action for U.S. patent application Ser. No. 09/619,044, filed Jul. 19, 2000.

Sep. 26, 2002. Office Action for U.S. patent application Ser. No. 09/637,620, filed Aug. 11, 2000.

Oct. 23, 2002. Office Action for U.S. patent application Ser. No. 09/469,227, filed Dec. 22, 1999.

Dec. 17, 2002. Office Action for U.S. patent application Ser. No. 09/363,966, filed Jul. 29, 1999.

Feb. 10, 2003. Office Action for U.S. patent application Ser. No. 09/619,044, filed Jul. 19, 2000.

Apr. 9, 2003. Office Action for U.S. patent application Ser. No. 09/928,474, filed Aug. 14, 2001.

May 8, 2003. Office Action for U.S. patent application Ser. No. 09/637,620, filed Aug. 11, 2000.

Jun. 18, 2003. Office Action for U.S. patent application Ser. No. 09/655,542, filed Sep. 6, 2000.

Aug. 8, 2003. International Search Report for PCT/US03/08513.

Aug. 25, 2003. Office Action for U.S. patent application Ser. No. 10/100,184, filed Mar. 19, 2002.

Sep. 15, 2003. Office Action for U.S. patent application Ser. No. 09/928,474, filed Aug. 14, 2001.

Nov. 5, 2003. Office Action for U.S. patent application Ser. No. 10/172,977, filed Jun. 18, 2002.

Dec. 1, 2003. Office Action for U.S. patent application Ser. No. 10/173,108, filed Jun. 18, 2002.

Dec. 11, 2003. Office Action for U.S. patent application Ser. No. 09/943,383, filed Aug. 31, 2001.

Dec. 16, 2003. International Search Report for PCT/US03/23964.

Jan. 20, 2004. Office Action for U.S. patent application Ser. No. 09/927,444, filed Aug. 13, 2001.

Jan. 23, 2004. International Search Report for PCT/US02/24860.

Feb. 2, 2004. Office Action for U.S. patent application Ser. No. 09/363,966, filed Jul. 29, 1999.

IslamRaja, M. M., C. Chang, J. P. McVittie, M. A. Cappelli, and K. C. Saraswat. May/Jun. 1993. "Two Precursor Model for Low–Pressure Chemical Vapor Deposition of Silicon Dioxide from Tetraethylorthosilicate." *J. Vac. Sci. Technol. B,* vol. 11, No. 3, pp. 720–726.

Kim, Eui Jung and William N. Gill. Jul. 1994. "Analytical Model for Chemical Vapor Deposition of $SiO_2$ Films Using Tetraethoxysliane and Ozone" (Abstract). *Journal of Crystal Growth,* vol. 140, Issues 3–4, pp. 315–326.

Guo, R.S, A. Chen, C.L. Tseng, I.K. Fong, A. Yang, C.L. Lee, C.H. Wu, S. Lin, S.J. Huang, Y.C. Lee, S.G. Chang, and M.Y. Lee. Jun. 16–17, 1998. "A Real–Time Equipment Monitoring and Fault Detection System." *Semiconductor Manufacturing Technology Workshop,* pp. 111–121.

Lantz, Mikkel. 1999. "Equipment and APC Integration at AMD with Workstream." *IEEE,* pp. 325–327.

Jul. 15, 2004. Office Action for U.S. Appl. No. 10/172,977, filed Jun. 18, 2002.

Aug. 2, 2004. Office Action for U.S. Appl. No. 10/174,377, filed Jun. 18, 2002.

Aug. 9, 2004. Written Opinion for PCT Serial No. PCT/US02/19063.

Aug. 18, 2004. International Preliminary Examination Report for PCT Serial No. PCT/US02/19116.

Aug. 24, 2004. Office Action for U.S. Appl. No. 10/135,405, filed May 1, 2002.

Aug. 25, 2004. Office Action for U.S. Appl. No. 09/998,384, filed Nov. 30, 2001.

Sep. 9, 2004. Written Opinion for PCT Serial No. PCT/US02/21942.

Sep. 16, 2004. International Preliminary Examination Report for PCT Serial No. PCT/US02/24859.

Rauf, Shahid and Mark J. Kushner. Aug. 1998. "Virtual Plasma Equipment Model: A Tool for Investigating Feedback Control in Plasma Processing Equipment." *IEEE Transactions on Semiconductor Manufacturing.* vol. 11, No. 3. pp. 486–494.

Rauf, Shahid and Mark J. Kushner. "Controller design issues in the feedback control of radio frequency plasma processing reactors." *J. Vac. Sci. Technol. A.* vol. 17, No. 3. pp. 704–712.

Sep. 15, 2004. Office Action for U.S. Appl. No. 10/632,107, filed Aug. 1, 2003.

Sep. 29, 2004. Office Action for U.S. Appl. No. 09/363,966, filed Jul. 29, 1999.

Oct. 1, 2004. International Preliminary Examination Report for PCT Serial No. PCT/US03/23964.

Oct. 6, 2004. Office Action for U.S. Appl. No. 10/759,108, filed Jan. 20, 2004.

Oct. 12, 2004. International Preliminary Examination Report for PCT Serial No. PCT/US02/19061.

Nov. 17, 2004. Written Opinion for PCT Serial No. PCT/US01/27407.

Oct. 12, 2004. International Preliminary Examination Report from PCT Application No. PCT/US02/19061.

Oct. 6, 2004. Office Action from U.S. Appl. No. 10/759,108, filed Jan. 20, 2004.

Oct. 1, 2004. International Preliminary Examination Report from PCT Application No. PCT/US03/23964.

Sep. 29, 2004. Office Action from U.S. Appl. No. 09/363,966, filed Jul. 29, 1999.

Sep. 15, 2004. Office Action from U.S. Appl. No. 10/632,107, filed Aug. 1, 2003.

Sun, S.C. 1998. "CVD and PVD Transition Metal Nitrides as Diffusion Barriers for Cu Metallization." *IEEE*, pp. 243–246.

Tagami, M., A. Furuya, T. Onodera, and Y. Hayashi. 1999. "Layered Ta–nitrides (LTN) Barrier Film by Power Swing Sputtering (PSS) Technique for MOCVD–Cu Damascene Interconnects." *IEEE*. pp. 635–638.

Yamagishi, H., Z. Tokei, G.P. Beyer, R. Donaton, H. Bender, T. Nogami, and K. Maex. 2000. "TEM/SEM Investigation and Electrical Evaluation of a Bottomless I–PVD TA(N) Barrier in Dual Damascene" (Abstract). *Advanced Metallization Conference 2000.* San Diego, CA.

Eisenbraun, Eric, Oscar van der Straten, Yu Zhu, Katharine Dovidenko, and Alain Kaloyeros. 2001. "Atomic Layer Deposition (ALD) of Tantalum–Based Materials for Zero Thickness Copper Barrier Applications" (Abstract). *IEEE*. pp. 207–209.

Smith, S.R., K.E. Elers, T. Jacobs, V. Blaschke, and K. Pfeifer. 2001. "Physical and Electrical Characterization of ALD Tin Used as a Copper Diffusion Barrier in 0.25 mum, Dual Damascene Backend Structures" (Abstract). *Advanced Metallization Conference 2001.* Montreal, Quebec.

Kim, Y.T. and H. Sim. 2002. "Characteristics of Pulse Plasma Enhanced Atomic Layer Deposition of Tungsten Nitride Diffusion Barrier for Copper Interconnect" (Abstract). *IEIC Technical Report*. vol. 102, No. 178, pp. 115–118.

Elers, Kai–Erik, Ville Saanila, Pekka J. Soininen, Wei–Min Li, Juhana T. Kostamo, Suvi Haukka, Jyrki Juhanoja, and Wim F.A. Besling. 2002. "Diffusion Barrier Deposition on a Copper Surface by Atomic Layer Deposition" (Abstract). *Advanced Materials*. vol. 14, No. 13–14, pp. 149–153.

Peng, C.H., C.H. Hsieh, C.L. Huang, J.C. Lin, M.H. Tsai, M.W. Lin, C.L. Chang, Winston S. Shue, and M.S. Liang. 2002. "A 90nm Generation Copper Dual Damascene Technology with ALD TaN Barrier." *IEEE*. pp. 603–606.

Van der Straten, O., Y. Zhu, E. Eisenbraun, and A. Kaloyeros. 2002. "Thermal and Electrical Barrier Performance Testing of Ultrathin Atomic Layer Deposition Tantalum–Based Materials for Nanoscale Copper Metallization." *IEEE*. pp. 188–190.

Wu, Z.C., Y.C. Lu, C.C. Chiang, M.C. Chen, B.T. Chen, G.J. Wang, Y.T. Chen, J.L. Huang, S.M. Jang, and M.S: Liang. 2002. "Advanced Metal Barrier Free Cu Damascene Interconnects with PECVD Silicon Carbide Barriers for 90/65–nm BEOL Technology." *IEEE*. pp. 595–598.

Jul. 25, 2003. International Search Report for PCT/US02/24858.

Mar. 30, 2004. Written Opinion for PCT/US02/19062.

Apr. 9, 2004. Written Opinion for PCT/US02/19116.

Apr. 22, 2004. Office Action for U.S. Appl. No. 09/998,372, filed Nov. 30, 2001.

Apr. 28, 2004. Written Opinion for PCT/US02/19117.

Apr. 29, 2004. Written Opinion for PCT/US02/19061.

May 5, 2004. Office Action for U.S. Appl. No. 09/943,955, filed Aug. 31, 2001.

May 5, 2004. International Preliminary Examination Report for PCT/US01/27406.

May 28, 2004. Office Action for U.S. Appl. No. 09/943,383, filed Aug. 31, 2001.

Jun. 3, 2004. Office Action for U.S. Appl. No. 09/928,474, filed Aug. 14, 2001.

Jun. 23, 2004. Office Action for U.S. Appl. No. 10/686,589, filed Oct. 17, 2003.

Jun. 30, 2004. Office Action for U.S. Appl. No. 09/800,980, filed Mar. 8, 2001.

Jul. 12, 2004. Office Action for U.S. Appl. No. 10/173,108, filed Jun. 8, 2001.

* cited by examiner

FEEDBACK CONTROL OF PLASMA-ENHANCED CHEMICAL VAPOR DEPOSITION PROCESSES

RELATED APPLICATIONS

This application claims priority under 35 U.S.C. §119(e) from provisional application Ser. No. 60/298,878 filed Jun. 19, 2001, which is incorporated by reference.

This application claims priority under 35 U.S.C. §119(e) from provisional application Ser. No. 60/349,576 filed Oct. 29, 2001, which is incorporated by reference.

This application claims priority under 35 U.S.C. § 119(e) from provisional application Ser. No. 60/366,699 filed Mar. 21, 2002, which is incorporated by reference.

This application is related to co-pending application filed on even date herewith entitled "Feedback Control of Sub-Atmospheric Chemical Vapor Deposition Process," which is incorporated by reference.

FIELD OF THE INVENTION

The present invention generally relates to process control of thin films deposition using chemical vapor deposition and more particularly to a method, apparatus and medium for providing feedback control of the plasma-enhanced chemical vapor deposition (PECVD) deposition process.

BACKGROUND OF THE INVENTION

Plasma-enhanced chemical vapor deposition is used in semiconductor manufacturing to deposit thin films on substrates, for example, to deposit a silicon dioxide film on a silicon wafer. Thin film deposition of dielectrics such as silicon dioxide or Black Diamond™ is an important step in many fabrication processes, such as formation of pre-metal dielectrics (PMD), in shallow trench isolation (STI) and deposition of interlayer dielectrics (ILD). In these and other processes, the deposited film properties, i.e., film thickness, chemical homogeneity, and optical and mechanical properties, are important to the final device properties.

In most applications, a layer is deposited over existing features on a device. The excess coating is removed, or the variation in the coating is reduced in a subsequent chemical-mechanical deposition (CMP) step. The deposited film may also have features that are created on the film using a lithography process, followed by an etch process. Thin film deposition is an inherently complex process, thereby making it hard to simultaneously control film characteristics, such as optical and electrical properties, stresses in the film, etc., while maintaining uniform film thickness. Thin film deposition processes typically "drift" over time, causing the deposited film to deviate significantly from target values. Specifically, plasma enhanced chemical vapor deposition introduces both radial and azimuthal thickness non-uniformity, both within and among wafers. While film thickness non-uniformity can be addressed in the subsequent CMP polishing step, the greater the deposition-induced non-uniformity, the more difficult it is to achieve within wafer uniformity in subsequent steps.

As microelectronics device feature sizes continue to shrink, it is necessary to have tighter controls in fabrication to maintain high yields. The semiconductor industry has developed run-to-run control of the various processing steps in a semiconductor fabrication process in order to maintain tighter control over process output. In run-to-run control, a product recipe with respect to a particular machine process is modified between machine runs so as to minimize process drift, shift and variability. Post-process measurements are made periodically and are used along with empirical process models and drift compensation techniques to suggest new equipment settings for the next run. The development of feedback control has been largely empirical, based upon experimentally observed correlations between input and output measurements.

There has been some investigation into feedback control of plasma etch and deposition processes, both experimental and theoretical. Implementation of process control in these operations has been limited due to unavailability of suitable in situ measurements, limited process understanding and non-automated operational practices. Improvements in advanced process control and reduction of run-to-run variability in a plasma enhanced chemical vapor deposition process are thus desired.

SUMMARY OF THE INVENTION

The present invention relates to a method, apparatus and medium for process control of plasma chemical vapor deposition of a thin film onto a surface of a substrate, for example, a semiconductor wafer, in order to improve wafer to wafer and within wafer uniformity of the thin film properties. The present invention uses a model (which can be implemented as a single model or multiple models) of the thin film deposition process to predict film deposition rate, film thickness uniformity and/or other film properties across the wafer surface. Deviations from the predicted outcome are used to update the model and set new deposition recipe, which feed back into the process to enhance process results.

The use of multiple wafer regions in the deposition model that defines the deposited film (as contemplated by one or more embodiments of the present invention) provides greater control over the cross-film thickness. Furthermore, the methods, apparatus and mediums of the present invention (in one or more embodiments thereof) provide a model that distinguishes between deposition processes being carried out in different deposition chambers of the tool and between deposition parameters that are independently or commonly controlled for each chamber, thereby providing a better approximation of the tool state in each chamber. The methods, apparatus and mediums of the present invention (in one or more embodiments thereof) also provide a model that defines the relationship between the deposition parameters and film properties other than film thickness, allowing control of the chemical, optical and/or material properties of the thin film. In addition, the methods, apparatus and mediums of the present invention (in one or more embodiments thereof) provide models that better approximate tool behavior by accounting for effects such as tool idle time, the effect of earlier-processed wafers on the current wafer, or the reliability of a value for a measured film quality. These and other aspects of the present invention allow for better estimation of tool behavior and the prediction of optimal deposition recipes for achieving a target output, thus overcoming deficiencies of the conventional technology.

In one aspect of the invention, a method of film deposition in a chemical vapor deposition (CVD) process includes:
  a) providing a model for CVD deposition of a film that defines a plurality of regions on a wafer and identifies one or more film properties for at least two regions of the wafer;
  b) depositing a film onto a wafer using a first deposition recipe comprising at least one deposition variable;
  c) measuring a film property for at least one of one or more film properties for the deposited film of step (b) for each of the at least two regions of the wafer;

(d) calculating an updated model based upon the measured film property profile of step (c) and the model of step (a); and (e) calculating an updated deposition recipe based upon the updated model of step (d) to maintain a target film property profile.

In one or more embodiments, the step of providing a model includes:

(f) depositing a film on at least one wafer in a deposition step having a deposition variable;

(g) identifying a plurality of regions of the at least one wafer and measuring a film property for each of the at least one wafers at each of the plurality of regions after the deposition of step (e); and (h) recording the deposition variable and measured film property for each of the plurality of regions on a recordable medium; and (i) fitting the data to a linear or non-linear curve that establishes a relationship between the film property of a region of the film and the deposition variable.

In another aspect of the invention, a method of film deposition in a plasma chemical vapor deposition (CVD) process includes:

a) providing a model for plasma CVD deposition of a film that identifies one or more film properties for the wafer and at least one deposition variable that correlates with the film property;

b) depositing a film onto a wafer using a first deposition recipe comprising the at least one deposition variable;

c) measuring the film property for at least one of one or more film properties for the deposited film of step (b) for the wafer;

d) calculating an updated deposition model based upon the measured film property of step (c) and the model of step (a); and e) calculating an updated deposition recipe based upon the updated model of step (d) to maintain a target film property profile.

In yet another aspect of the invention, a computer readable medium having instructions being executed by a computer is provided. The instructions include a computer-implemented software application for a plasma-enhanced chemical vapor deposition process, including (a) receiving data from a CVD tool relating to a deposition variable and a measured film property for each of a plurality of regions for at least one wafer; (b) calculating, from the data of step (a), a deposition model, wherein the model is calculated by determining the relationship between the film property of a region of a wafer and the deposition variable.

Another aspect of the invention includes a computer readable medium having instructions being executed by a computer. The instructions include a computer-implemented software application for a plasma chemical vapor deposition (CVD) process, with instructions for implementing the process including a) receiving data from a plasma CVD tool relating to the film property of at least one wafer processed in the plasma CVD deposition process; and b) calculating, from the data of step (a), an updated deposition model, wherein the updated deposition model is calculated by determining the difference between an output of a film deposition model and the data of step (a).

Still another aspect of the invention includes a plasma chemical vapor deposition tool for deposition of a film. The tool includes a plasma CVD apparatus comprising a chamber, a vacuum system, an RF generator for generating a source plasma, and a gas delivery system; controlling means capable of controlling an operating variable of the deposition process; and a controller operatively coupled to the controlling means, the controller operating the controlling means to adjust the operating variable of the deposition process as a function of a model for a film property. The model is a deposition model that identifies a film property and a deposition variable that correlates with the film property.

In still another aspect of the invention, a plasma chemical vapor deposition (CVD) tool for deposition of a film includes a) modeling means for defining a plurality of regions on a wafer and identifying one or more film properties for at least two of the regions of the wafer; b) means for depositing a film onto a wafer using a first deposition recipe comprising at least one deposition variable, wherein the at least one deposition variable correlates with the film property; c) means for measuring a film property for at least one of the one or more film properties for the deposited film of step (b) for each of the at least two regions of the wafer; d) means for calculating an updated model based upon the measured film property of step (c) and the model of step (a); and e) means for calculating an updated deposition recipe based upon the updated model of step (d) to maintain a target film property profile.

BRIEF DESCRIPTION OF THE DRAWING

Various objects, features, and advantages of the present invention can be more fully appreciated with reference to the following detailed description of the invention when considered in connection with the following figures, in which like reference numerals identify like elements. The following drawings are for the purpose of illustration only and are not intended to be limiting of the invention, the scope of which is set forth in the claims that follow.

DETAILED DESCRIPTION OF THE INVENTION

Figure 1A:
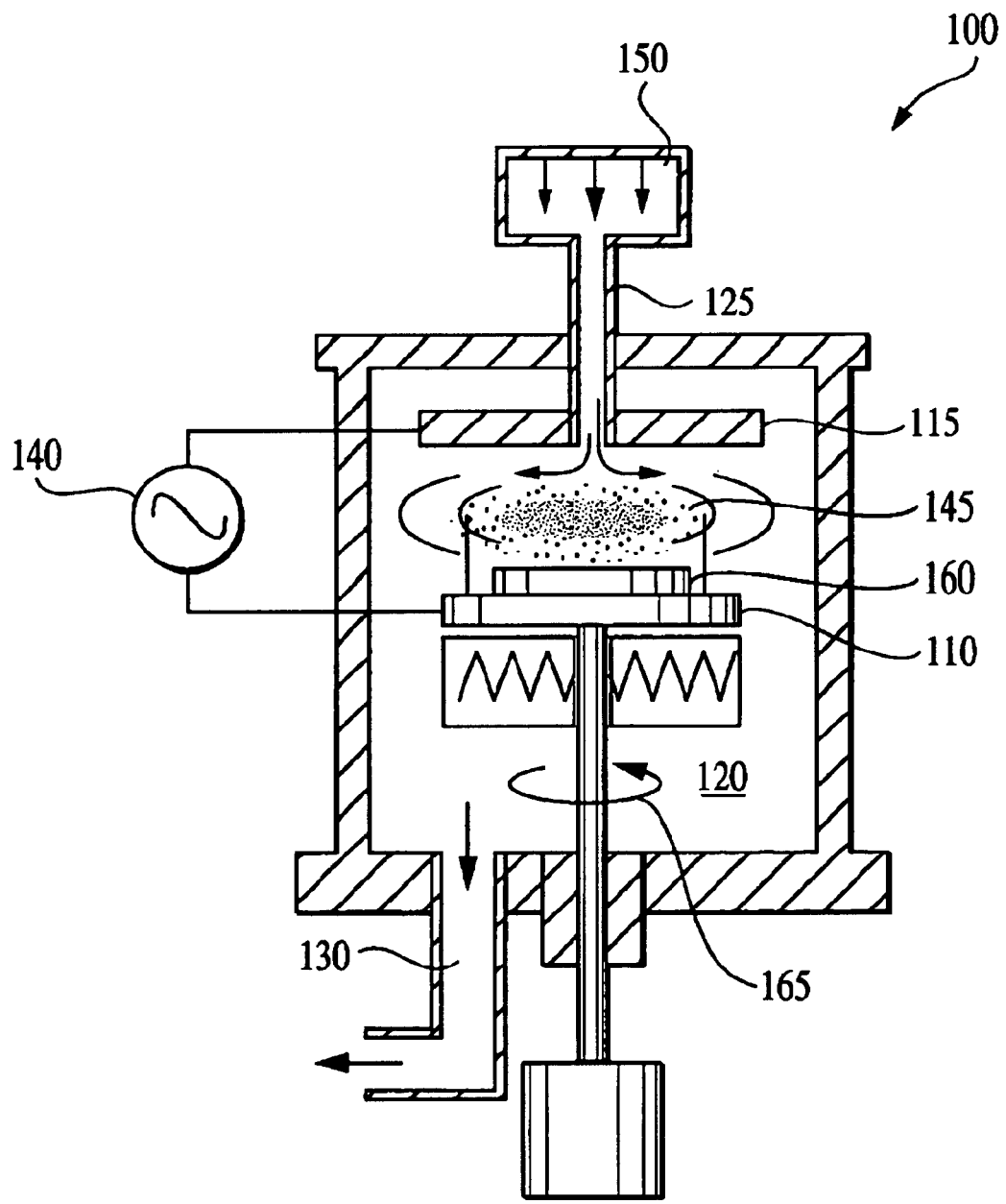
FIG. 1A is a schematic view of a plasma-enhanced chemical vapor deposition apparatus.

Plasma-enhanced chemical vapor deposition (PECVD) has been widely used in microelectronics fabrication to deposit films, such as a $SiO_2$, at low temperatures. In the PECVD process, a radio frequency (RF) glow discharge (plasma) supplies part of the energy to promote a desired chemical reaction on the surface of the substrate. FIG. 1A is a schematic illustration of an exemplary PECVD system 100 with parallel plate electrodes 110, 115. The system 100 includes a chamber 120, a vacuum system 130, an RF generator 140 for generating a source plasma 145, and a gas or fluid delivery system 150 for introduction of reactive gases. A wafer 160 for film deposition is placed on the grounded electrode 110. Reactive gases are introduced into a reaction chamber 120 through inlet 125 of the gas delivery system. In order to promote a uniform distribution, the reactive gases typically are introduced into the chamber at a source positioned opposite or a distance from the wafer. The wafer-containing electrode may be rotated for further uniformity of deposition, as indicated by arrow 165. The gas delivery system may include heating and cooling means (not shown) for maintaining a constant gas and chamber temperature. Wafers are transferred into and out of chamber 120 by a robot blade (not shown) through an insertion/removal opening (not shown) in the side of chamber 120. Two or more chambers may be connected. In at least some PECVD systems, the chambers share reactive gases, but have individual RF controls.

Figure 1B:
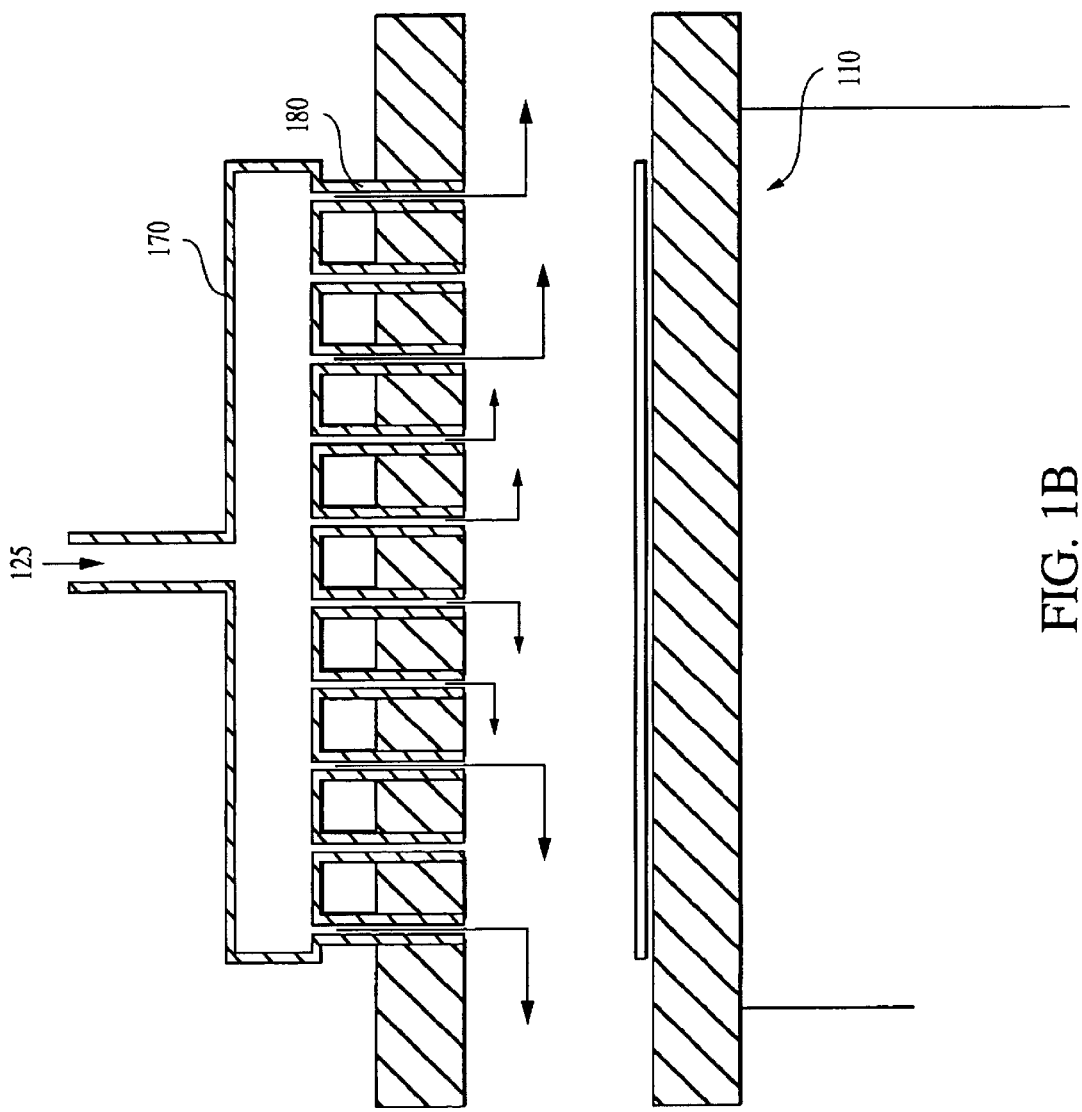
FIG. 1B is an enlarged view of the reaction chamber of the apparatus, for use in one or more embodiments of the invention.

FIG. 1B is an enlarged view of the PECVD reaction chamber illustrating an exemplary delivery system for the reactive gases used in the PECVD process. The gases are introduced through inlet 125 into a heated gas distribution head (showerhead) 170, which has outlets 180 at spaced intervals. As shown by arrows in FIG. 1B, the reactive gases then flow into the plasma gas. The energy of the plasma is transferred into the gas mixture, transforming the gas into reactive radicals, ions and other highly excited species. The energetic species then flow over the wafer, where they are deposited as a thin film. Since the formation of the reactive species takes place in the gas phase, the wafer can be maintained at low temperatures.

The term "target output" represents the desired processing outcome of a plasma enhanced chemical vapor deposition process. Some tolerance is built into the profile, so that the profile includes the target value and acceptable standard deviations therefrom. Film thicknesses falling within the standard deviation would not require updating of the deposition recipe. Thus, use of the term "target output" includes the target value and the standard deviation therefrom.

The term "wafer" is used in a general sense to include any substantially planar object onto which a film is deposited. Wafers include monolith structures or structures having one or more layers, thin films or other features already deposited thereon. "Thin film" and "film" may be used interchangeably, unless otherwise indicated.

An exemplary PECVD deposition system includes two or more chambers in which deposition of material occurs. The chambers may carry out the same process or different processes; some CVD systems are based on a series of operations, while some use parallel processing schemes. The chambers may thus process wafers in parallel, that is, each deposition chamber deposits a film on a wafer at the same time. The deposition recipe for each chamber may be the same or different. In one or more processes, the chambers share some processing parameters while others are independently controlled. For example, gas flow of reactant gases is common to both (or all) chambers, but RF power, RF time and showerhead spacing are independently controlled in each chamber.

The present invention is described with reference to PECVD, however is it readily apparent that other plasma CVD processes, such as high density plasma processes, are also contemplated. The present invention also is applicable to CVD systems using either a batch process or inline process. An inline process refers to a process in which all wafers going through a system go through a sequence of steps and those steps may be carried out in different chambers, whereas a batch process refers to a process in which a wafer goes to any one of the chambers in the system, where the entire deposition is then carried out. The PECVD processes described above may be modeled to provide a format for improving the deposition process. The process model should accurately predict the thin film characteristics (output) for a given set of input conditions. The run-to-run film characteristics are improved or maintained by adjusting the deposition parameters during plasma enhanced deposition to correct for unmodeled effects or to correct for drift in the deposition process conditions. Run-to-run control can be defined as wafer-to-wafer or lot-to-lot, depending upon the processes being controlled and the available methods for monitoring output.

Figure 2:
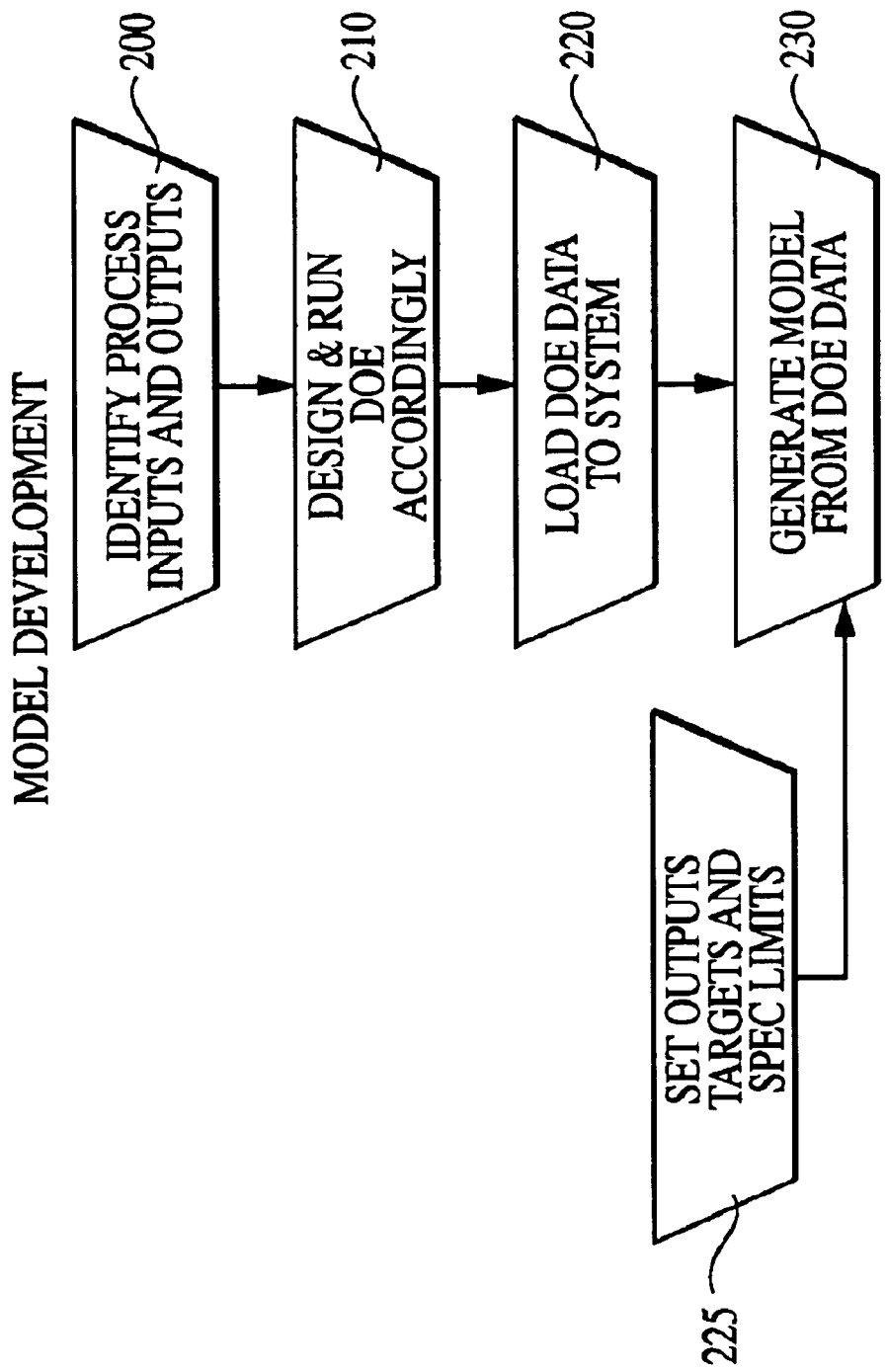
FIG. 2 is a flow diagram generally illustrating model development.

According to one or more embodiments of the present invention, an initial model is developed based upon knowledge of the film deposition process, as is shown in a flow diagram (FIG. 2). An initial understanding of the system is acquired in step 200, which is used to design and run a design of experiments (DOE) of step 210. The DOE desirably is designed to establish the relationship between or among variables that have a strong and predictable impact on the processing output one wishes to control, e.g., film thickness or some other film property. The DOE provides data relating to process parameters and process outcome, which is then loaded to the advanced process control system in step 220. The advanced process control system may be a controller or computer that uses the data to create and update the model. The model can be represented as raw data that reflects the system, or it can be represented by equations, for example multiple input-multiple output linear, quadratic and general non-linear equations, which describe the relationship among the variables of the system. Process requirements such as output targets and process specification are determined by the user in step 225, which are combined with the DOE data to generate a working model in step 230.

Figure 3:
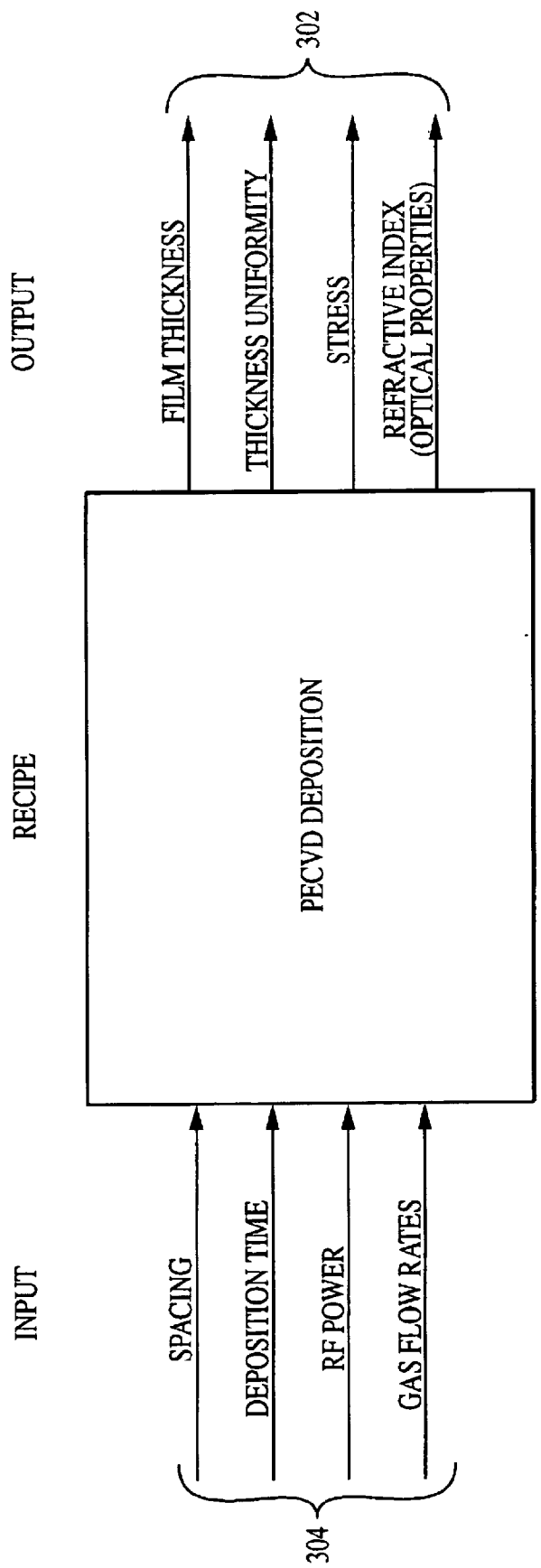
FIG. 3 is a schematic illustration showing the relationship between input and output parameters in one or more embodiments of the present invention.

In developing the model, film properties of interest 302 are identified and outcome determinative processing variables 304 are selected for the model, as illustrated schematically in FIG. 3. The specific film properties of interest may vary depending upon the type of film deposited, and thus the film properties of interest 302 and processing variables 304 of FIG. 3 are shown by way of example.

Regardless of the type of film substance for which a model is created, to obtain DOE data, an experiment is run which perturbs or varies values of the processing variables of interest about a center point (or median value). One or more processing variables can be varied. The film properties of interest in the resultant film are measured for each combination of inputs. Data can be acquired empirically, by carrying out a series of experiments over a range of parameter values of the processing variables. The data is fit to the appropriate curve (linear or non-linear) to define the model.

Undoped silica glass (USG) is commonly deposited by PECVD and a model development is discussed below with specific reference to USG, although it is readily apparent that the methodology can be used to develop models for any other PECVD film deposition process, as well as CVD (i.e., non-plasma enhanced) processes.

In one or more embodiments of the present invention, the film properties of interest for USG film include one or more of film thickness, film thickness uniformity, stress and refractive index (RI). In at least some embodiments of the present invention, the model accounts for two or more film properties, for example, the model describes the effect of process variables on film thickness (deposition rate) and film stress, or on film thickness and refractive index. Process variables for deposition of the USG film include one or more of ozone flow rate, reactive gas flow rate, carrier gas flow rate, chamber pressure and showerhead spacing (distance) from the substrate, as well as total deposition time. Deposition time is controlled by RF power and RF time. For the deposition of USG films, reactive gases typically include ozone ($O_3$), oxygen ($O_2$), and tetraethylorthosilicate (TEOS) or, alternatively, silane ($SiH_4$).

Models for other film deposition systems can be similarly developed using the processing variables and film properties specific to those films. For example, the deposition of dielectric anti-reflective coating (DARC) films may be modeled and controlled in a manner similar to that described for the USG-based films. The precursors in the case of DARC films are silane ($SiH_4$) and $N_2O$, which are reacted within a plasma to deposit the resultant film. The flow rates of these gases along with the spacing and deposition time are used to control the average film thickness, thickness uniformity, refractive index, extinction coefficient and stress.

The deposition of fluorosilicate glass (FSG) films can also be modeled. In this case, the average film thickness, film thickness uniformity, refractive index, and fluorine concentration can be modeled and controlled using spacing, deposition time, $SiF_4$ flow rate, and high and low frequency RF power. In one or more embodiments, a component of the control of this film type is that both thickness and dopant concentration are controlled simultaneously.

For Black Diamond™ (BD) films, which are deposited using trimethylsilane (TMS) as a reactant gas, the effects of RF power, spacing, $O_2$ flow rate, TMS flow rate, chamber pressure and deposition time are variables that can be included in a model used to control average film thickness, film thickness uniformity and refractive index. Furthermore, the carbon content of BD films can be provided as feed-forward data to the etching tool, as this factor is relevant in control of etch rate. Using a relationship between the etch uniformity and carbon content of the BD film, the etch recipe can be modified to moderate etch rate nonuniformity.

On the Producer™ system from Applied Materials of Santa Clara, Calif., the RF time, and hence deposition time, of each chamber is individually controllable, and the gas flow rates are common to all chambers of the PECVD system. In one or more embodiments of the present invention, the model can distinguish between the two types of processing variables (individual and common) and account for them accordingly. As discussed herein below, the model permits simultaneous optimization of more than one variable.

Figure 4:
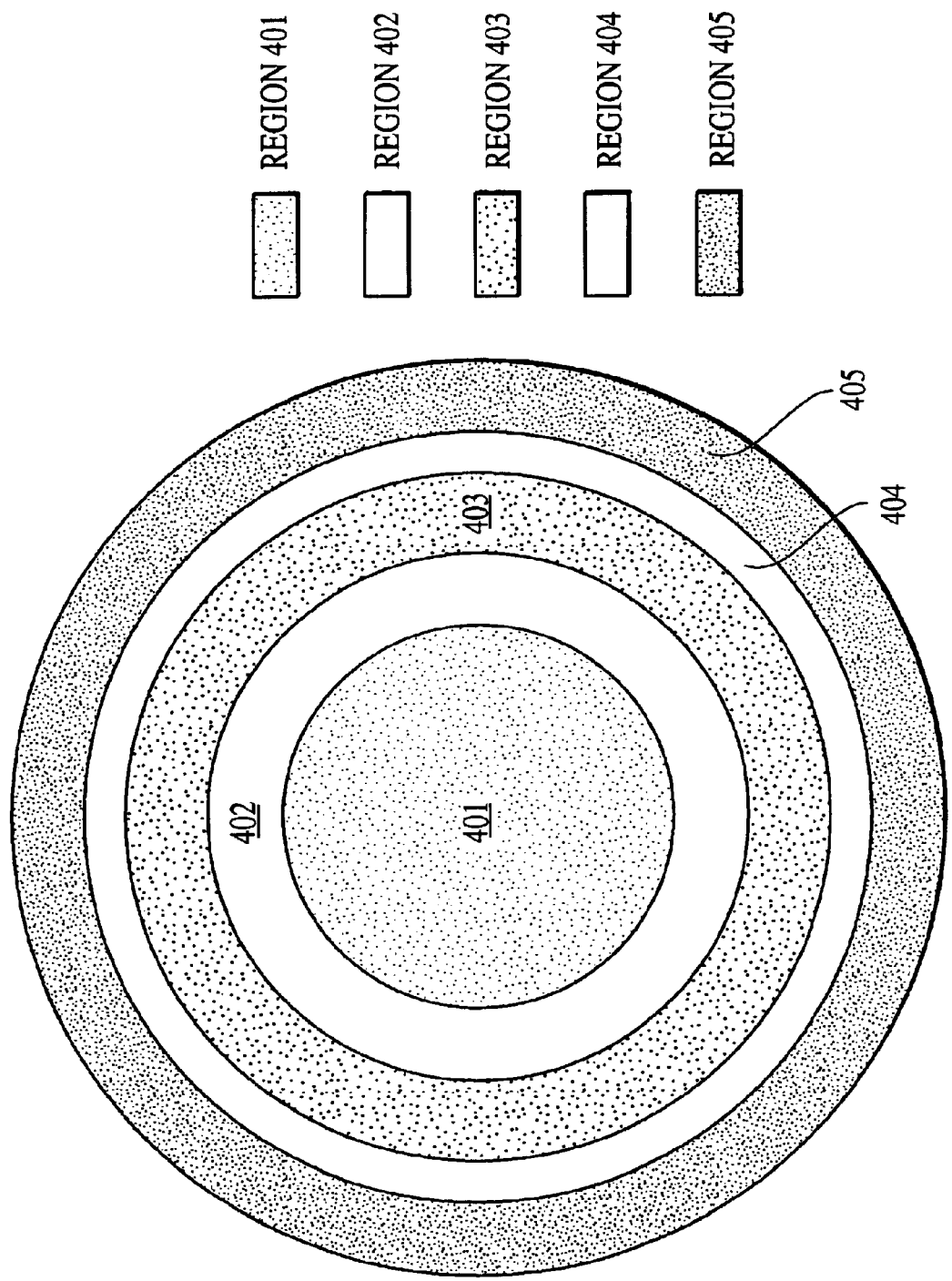
FIG. 4 schematic illustration of a wafer showing regions defined for thickness profile model.

In one or more embodiments of the present invention, the model defines two or more different film property, e.g., film thickness, regions of the wafer. As is shown in FIG. 4, a wafer is divided into radial regions 401 through 405 of varying width and area. The number, size and location of the regions also can vary and may be selected based upon any number of factors, including the variability or uniformity of the film property in a given region of the wafer. In one or more embodiments of the present invention, it is desirable that the film property in any given region be substantially uniform, particularly in those cases where, for example, a number of wafer thickness measurements within a region are averaged to define the region-averaged thickness profile. Thus, at the edges of the wafer where edge effects can be dramatic, narrow regions encompassing only the outer portions of the wafer may be selected. Near the center of the wafer where deposition effects may be subtler, a larger region may be defined. In one or more embodiments of the present invention, the regions are defined such that all azimuthal variation is averaged out. In one or more embodiments of the present invention, the use of an input value is contemplated to correct and account for azimuthal variation. Film property measurements taken within a region of the wafer are averaged to give the average thickness for that region.

By way of example (with particular regard to film thickness), the five wafer regions of FIG. 4 can be defined as shown in Table 1 for a wafer that is 95 mm in diameter.

TABLE 1

| Region | 401 | 402 | 403 | 404 | 405 |
|---|---|---|---|---|---|
| Radius, mm | 5–40 | 40–60 | 60–80 | 80–92 | 92–95 |

With the regions defined as in Table 1, all thin film thickness measurement points with a radial distance from the wafer center greater than 5 mm, but less than 40 mm, are averaged together to give the thickness of region 401. The thicknesses for all other regions are similarly calculated, but region 405 includes all points greater than 92 mm and up to and including 95 mm. Thus, a film is deposited by PECVD and, based upon post-measurements and deposition time and/or other processing variables, a film thickness and deposition rate can be determined for each region.

In one or more embodiments of the present invention, a film property of interest is film thickness and one of the processing parameters is deposition time. In one or more embodiments of the present invention, a processing parameter is spacing of the showerhead from the wafer. Because deposition only occurs when RF power is activated, RF power time is directly correlated to deposition time. Since there are separate RF sources for each chamber in the PECVD system, the RF power time for each chamber can be varied as a means for controlling final film thickness. This provides the ability to control thin film final thickness even in the presence of differences in the chamber performances. Varying the spacing between the showerhead and the wafer also can control the film thickness, in this case, independently for each chamber. Similarly, changes in the supplied RF power also effects deposition rate. While film thickness is the measured output, it is appreciated that the information can be represented as a film deposition rate (film thickness per unit time) or as a film thickness profile (film thickness per unit area).

While film thickness and thickness uniformity are typically the tool behaviors being modeled, models for other film properties, such as stress and RI, can be developed by manipulating RF power and showerhead spacing or other processing variables. Multiple models for different film properties can be developed and used to describe the deposition process.

Once data from DOE runs are obtained, regression methods (or any other suitable method) may be used to determine a model that obeys the behavior of the process within the range of inputs that were used in the experiments. In one or more embodiments, the model for an i-chamber system is defined as shown in eq. (1), $$\text{Film\_thickness}_{ij} = DR_{ij} \cdot \text{time}_i \qquad (1)$$

where i is the ith chamber of deposition chamber, and $DR_{ij}$ is the deposition rate for annular region j of the wafer in chamber i, where no Einstein summation has been used for the indices. The model is determined for each region of the wafer, and together the models define a film thickness profile across the wafer. Thus, the model can predict a film thickness profile by entering hypothetical variables into the model equation. In use, a measured film thickness profile is used to further refine the model in order to obtain updated parameters and thus an updated process recipe.

The processing variable for a basic model is typically process time; however, additional parameters can be included in the model. The relationship can be expressed generally as:

$$Q_{ij}=g(x_1,x_2 \ldots x_n) \quad (2a)$$

where Q is some film property in region j on a wafer in chamber i which is the result of a processing run; g( ) is some linear or nonlinear function of $x_1, x_2, \ldots, x_n$ on recipe parameters or tool state parameters which affect the resulting film property Q. If the film property of interest is thickness, the function g( ) represents the deposition rate as a function of recipe parameters or tool state parameters. The thickness for each region j of wafer in chamber i would then be derived by multiplying the deposition rate by the deposition time as shown below.

$$\text{Film\_thickness}_{ij}=g_{ij}(x_1,x_2, \ldots ,x_n) \cdot \text{time}_i \quad (2b)$$

A model including additional processing parameters is shown in eqs. (2c)–(2e).

$$\text{Film\_thickness}_{ij}=(c_{1ij} \cdot \text{spacing}_i + c_{2ij} \cdot \text{power}_i + c_{3ij} \cdot TEOS\_\text{flow}+c_4) \cdot \text{time}_i \quad (2c)$$

$$\text{Stress}_i=(b_{1i} \cdot \text{spacing}_i + b_{2i} \cdot \text{power}_i + b_{3i} \cdot TEOS\_\text{flow}+b_4) \quad (2d)$$

$$RI_i=(a_{1i} \cdot \text{spacing}_i + a_{2i} \cdot \text{power}_i + a_{3i} \cdot TEOS\_\text{flow}+a_4) \quad (2e)$$

where $c_{1ij}$ through $c_{4ij}$ are the parameters which provide the contribution of the particular processing parameter to the deposition rate in region j for a wafer in the $i^{th}$ chamber; $b_{1i}$ through $b_{4i}$ are the parameters which provide the contribution of the particular processing parameter to the film stress for the wafer in the ith chamber, and $a_{1i}$ through $a_{4i}$ are the parameters which provide the contribution of the particular processing parameter to the refractive index of the film to the wafer in the ith chamber. In one or more embodiments of the present invention, the film property, e.g., film thickness, is modeled in defined annular regions on the wafer. In one or more embodiments of the present invention, film properties, e.g., stress and refractive index, are modeled for the entire film.

The model takes into account common processing parameters that affect all chambers and independent processing parameters that affect each chamber individually. The relationships can also be adapted to reflect models where one or more regions of the film correspond to different annular regions of the wafer. This allows the controller to perform controls on multiple film regions simultaneously. This multiple region control provides control of within wafer uniformity. Thus, the model can account for an unlimited number of processing variables and permits their optimization while taking into consideration whether they affect all or only individual deposition chambers, or whether they affect different regions of the film differently.

In one or more embodiments of the present invention, the model may be further augmented to include the effect of the tool state. The tool state takes into consideration the effect of wear and use on the tool, here, a PECVD apparatus. This function is typically expressed as a scaling factor that takes the tool state into consideration. Factors that can affect tool state include idle time (time since last film deposition) and frequency of cleaning (or number of wafers deposited between cleaning or other shut down operation, such as preventative maintenance).

The first wafers coated after the deposition system has been idle typically have a different deposition rate than subsequently coated wafers, a situation known as the "first wafer effect". In one or more embodiments of the present invention, the model is further modified to account for the effect of tool idle time on deposition rate. The model accounts for such variations on deposition by monitoring the idle time of the system and adjusting the deposition rate accordingly. Thus, a statement is placed within the model, which reflects the effect of idle time on processing, such as:

If (idle time)>5 min

Deposition time=x; (3)

Else

Deposition time=y.

This captures idle time dependence within the model. In one or more embodiments of the present invention, the model has a more gradual change from one deposition rate to another and is given by the following equation:

$$DR_{idle}=DR_{no\_idle} \cdot (d_1 \cdot \tan^{-1}(d_2 \cdot \text{idle\_time}+d_3)+d_4) \quad (4)$$

where $DR_{idle}$ is the deposition rate with the effect of idle time, $DR_{no\_idle}$ is the deposition rate when there is no idle time, $d_1$ and $d_4$ determines the maximum change in deposition rate which is caused by idle time, $d_2$ determines the rate at which this change occurs, and $d_3$ determines at what idle time the change in deposition rate begins to be significant. In the general case, the effect of deposition rate or idle time can be given by the following equation:

$$DR^{idle}=f(DR_{no\_idle},\text{idle\_time},x_1,x_2, \ldots x_n) \quad (5)$$

where f( ) is some function which describes how the deposition rate is a function of: the deposition rate when there is no idle time, the idle time, and other past or current processing parameters related to the controller, tool state, or wafer state, here denoted by $x_1, x_2, \ldots, x_n$.

The "first wafer effect" is a member of a broader class of events, in which a single wafer measurement differs significantly from previous and subsequent measurements run on a specific tool or resource and, as such, does not represent an accurate representation of the process tool during normal operation. Accordingly, when these measurements are used in a feedback control system, this erroneous information may cause the system performance to deteriorate. These sudden changes can be the result of abrupt changes in the processing equipment, such as starting up the process after the system has been idle for a time, or it can be due to processing errors, such as an error in the metrology system. Since these sudden changes do not accurately reflect the subsequent behavior of the process tool, a methodology is used to evaluate the reliability of the measurement.

In one or more embodiments of the present invention, a methodology is provided within the model for assessing the reliability of the measurement. The methodology (i) estimates the intrinsic variation in the process, (ii) determines when a recent measurement is outside normal operating variation and, if so, marks the data as suspicious, and (iii)

ignores the data until a trend is determined from subsequent data. This methodology allows the system to be sensitive to changes that occur over more than one wafer, but also provides the system with robustness over metrology failures or situations similar to the first wafer effect.

One or more of the embodiments of the present invention are also capable of learning the extent of differences in the film property relationships between the first wafer and the next wafer on a resource (chamber or tool) specific basis, referred to generally as the "x-wafer effect." This is done by either maintaining a separate feedback loop for the first wafer versus the other wafers or by capturing the difference in the film property between first wafer and subsequent wafer on a resource specific basis. Resource specific refers to a particular tool or process being used.

Another case of an x-wafer effect in a CVD process arises out of the frequency of a "clean function" that is run in a chamber. If a clean recipe is run in between every wafer the film property tends to be identical; however, the clean recipe is time consuming. In this situation the chamber clean recipe is run every x wafers where x typically varies from 2 to 6. There is a change in the film property related to the nth wafer after the clean was run. The film property as a function of clean can be stated as $(1+n*a)*K$, where n is the wafer number after clean and a and K are variables relating the variation. Such variations can be captured by the model. The value of 'a' can also be learned on a resource specific basis.

It has been observed that, for some films, the film deposition rate increases with each wafer processed without an intervening chamber cleaning. In particular, high dielectric BLOk™ films show increasing film deposition rate with time. While not being bound to any mode or theory of operation, it is believed that material that builds up on the chamber during deposition affects deposition rate; and in the case of BLOk™ films, increases deposition time. Cleaning the chamber removes the built up residues and restores the chamber to its initial deposition conditions. Cleaning typically involves use of a plasma during film deposition.

If one can model the change in deposition rate as a function of chamber cleaning frequency, the number (or frequency) of chamber cleans can be reduced while concurrently reducing the film thickness variation. This results in an improvement in the overall efficiency of the process.

In a DOE-based model, a DOE identifies a correlation between number of wafers processed and deposition rate. One assumes that at least most film thicknesses are close to the target and k is a constant determined using DOE that defines how a particular run effects the deposition rate. Each wafer will have a different effect on the deposition rate because deposition of each wafer affects the deposition rate of the next wafer.

The model can be expressed as:

$$FT = \left(1 + k\sum_{i=1}^{N_w} T_i\right) \cdot DR \cdot t \tag{6}$$

where FT is the film thickness, $T_i$ is the target which corresponds to the $i^{th}$ wafer since the last clean, $N^w$ is the number of wafers processed since the last chamber clean, DR is the scaled deposition rate that corresponds to a chamber that has just been cleaned and t is the deposition time. The model thus predicts the wafer thickness (and thus the change in affect in wafer deposition rate) based upon the number of wafers run and depends upon an understanding of how k reflects the effect of wafer number on film deposition rate.

Another way of modeling the system is to use an on-line estimation approach. The approach assumes a linear relationship between the $i^{th}$ wafer and the $i^{th+1}$ wafer. The model is shown in the following eqs.:

$$\hat{FT} = \hat{DR} \cdot t \tag{7a}$$

$$\hat{DR} = DR_{i-1} + (DR_{i-1} - DR) \tag{7b}$$

$$DR_j = \frac{FT_j}{t_j} \tag{7c}$$

where $\hat{FT}$ is the predicted film thickness for wafer i, $\hat{DR}$ is the predicted deposition rate, which corresponds to the process to be performed on the wafer i, and $t_i$ is the deposition time for wafer i. $DR_j$ is the deposition rate for all j and $FT_j$ is the film thickness for all j, where j represents all the wafers used in the process between cleanings. The model employs a reset mechanism such that each time the chamber is cleaned, $\hat{DR}_{i-1}$ and $\hat{DR}_i$ are reset to some nominal values that are representative of the deposition rate of a clean chamber.

Application of the model provides variation in the deposition recipe with each successive wafer so that the film thickness remains constant even though the deposition rate is varying. Furthermore, application of the model would permit extension of the time (or number of wafers) between cleanings. Since the cleaning operation is relatively long, this improves the overall efficiency of the tool and an improvement of the yield of the resultant product.

Once a process model is available, the model can be used to calculate an optimal set of recipe parameters in order to deposit a uniform film to a desired thickness. Conversely, using models such as those just described, a prediction for region-averaged film thickness can be calculated given the deposition time and any other parameters that are measured or varied. By individually optimizing for the regions j of the wafer, greater control over the total surface is attainable. Thus, greater within wafer film uniformity is achieved.

An exemplary optimization method, which can be used in determining an updated model (based upon the differences between measured and predicted values for a target output), solves the equation:

$$\min_x f(y^{sp}, g(x)) \tag{8}$$

where x is a vector of recipe parameters and other processing parameters corresponding to the deposition recipe; g(x) is the model for the PECVD process which predicts the film properties based on a recipe and measurements related to tool state; $y^{sp}$ is a vector of the desired average region film thicknesses and/or other controlled film properties; and $f(y^{sp}, g(x))$ is some function which is meant to compensate for the deviation between the model predictions g(x) and the desired values $y^{sp}$. The updated model then is used to determine an updated deposition recipe.

Thus, the optimization method suggests that the model need not correct for 100% of the deviation from predicted values. A function may also be used, as contemplated by one or more embodiments of the present invention, to reflect uncertainty in the measured or calculated parameters, or to "damp" the effect of changing recipe parameters too quickly or to too great an extent. It is possible, for example, that without this "damping" effect the controller overcompensates for the measured deviations thereby necessitating another adjustment to react to the overcompensation. This leads to oscillations that may take several runs before the final, optimized conditions are realized.

Based upon this control method, the post-deposition film thickness is measured and the difference between the predicted thickness and the final (i.e., actual) thickness is determined. Other controlled film properties are measured, as needed by the model. In one or more embodiments of the present invention, the film property is measured on a lot-to-lot basis. In one or more embodiments of the present invention, the reliability of the data is assessed before the data is used in updating the model.

The error in prediction, also known as a bias, can then be linearly added into the model such that the actual final thickness more closely matches the predicted (and typically targeted) thickness. This bias is added to each region j, of wafer in chamber i, which is modeled as is shown in the following equation:

$$\text{Film\_thickness}_{ij} = g(x_1, x_2, \ldots x_n)_{ij} \cdot \text{time}_i + e_{ij} \quad (9)$$

where $e_{ij}$ is the bias term, which arises due to the difference between the predicted and actual amount, deposited for region j of wafer in chamber i. The process of linearly updating a model with bias terms based upon the difference between a model prediction and an actual measurement is part of at least some feedback control in one or more embodiments of the present invention.

Instead of (and/or, in addition to) use of the aforementioned bias, one or more embodiments of the present invention contemplate that an updated recipe can be calculated to optimize the available recipe parameters and to drive the predictions to a target value. The recipe parameters are changed such that the film thickness is made constant even though the deposition rate may be varying. A methodology that automatically changes the recipe to achieve consistent film thickness not only improves the consistency of the resultant film thickness, but also improves the productivity of the tool, since the system is subject to less frequent down time for reconditioning. This consistent film thickness then improves the yield of the resultant product.

Process model development and optimization are carried out with reference to a specific deposition system. That is, conditions that effect the thin film characteristics are specific to the type of thin film being deposited and the tool used for deposition. It is recognized that many other films are and can be deposited using PECVD, and that models for their deposition can be similarly developed using the methodology and guidelines set forth herein. In one or more embodiments of the present invention, it is contemplated that a separate model (or at least a supplement to a composite model) is created for each thin film that is deposited. Alternatively, a model may be developed in reference to a previously developed model. This model may be product specific and take the original model and scale it based upon the differences between the products.

An example the use of an initial model developed as described herein above to control the run-to-run average thickness and the thickness uniformity of the deposition process and to provide a feedback loop for updating the deposition recipe is shown schematically in FIG. 5. Briefly, one or more wafers is processed according to a first deposition recipe. The actual number of wafers depends on the complexity of the model and can be about 10, or as many as 20–30 or more. A thickness measurement is taken across the deposited film to obtain a film thickness profile, which is compared to the predicted film thickness profile calculated by the model. If the measured film thickness profile indicates deviation from the predicted results, those deviations are used to update the model to better reflect the behavior of the processing tool. The updated model is used to determine an updated recipe, which is then used in a feedback loop to progressively match the behavior of the processing tool and to optimize the recipe so as to improve or maintain within wafer film thickness uniformity.

Figure 5:
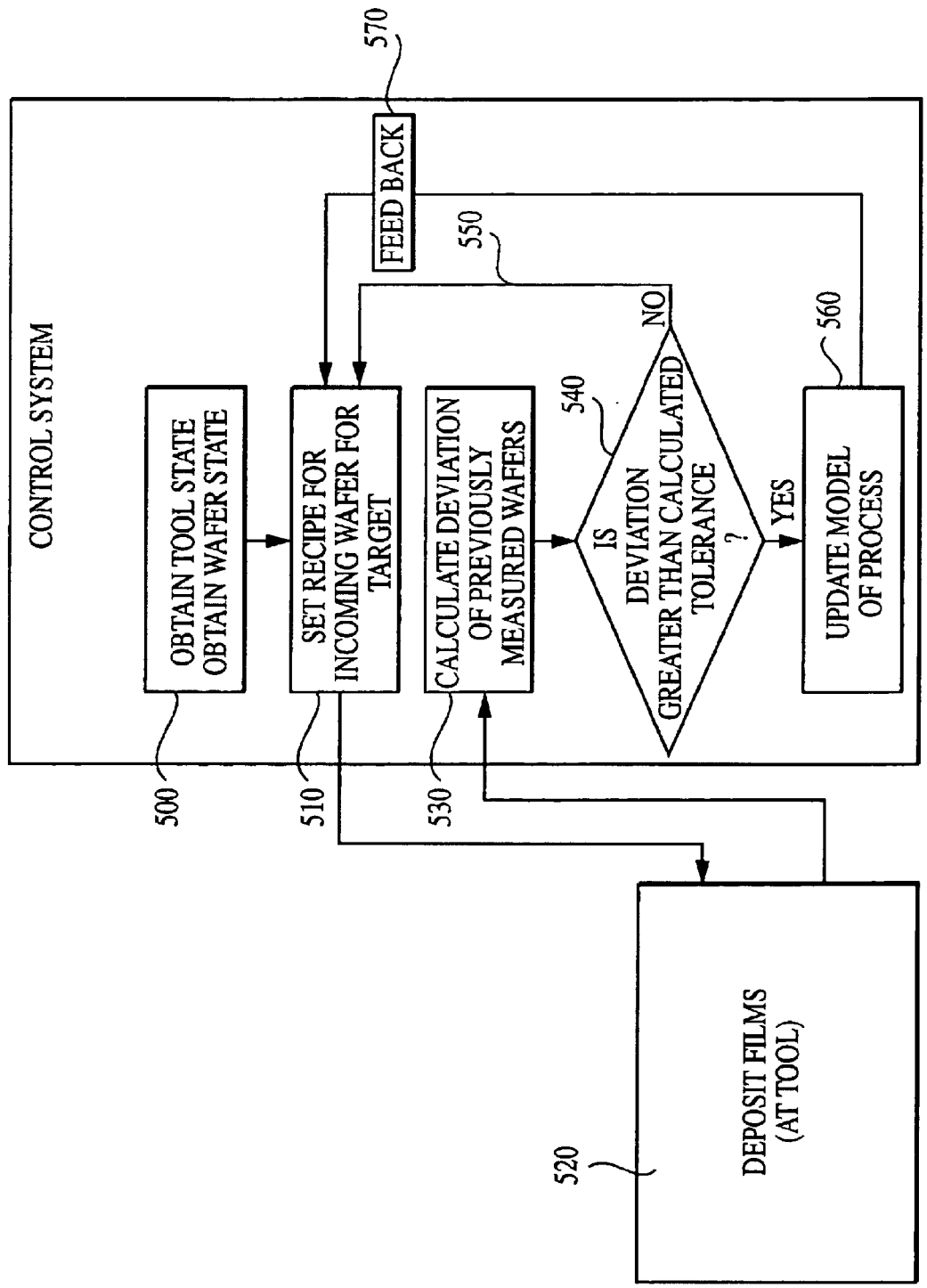
FIG. 5 is a flow diagram of the feedback loop used in a PECVD deposition operation, as contemplated by one or more embodiments of the present invention.

According to the processing flow diagram in FIG. 5, initial processing conditions (e.g., an initial tool state and initial wafer state) are identified that will provide a desired film deposition profile in step 500. The initial conditions may be determined empirically or by using the processing model of one or more embodiments of the present invention. If a processing model is used, a controller can use this model to calculate step times and processing parameters (i.e., to set the recipe for one or more incoming wafers) to deposit a film having a target (in some cases, a flat) profile on an incoming profile with a desired thickness, as shown in step 510. Thin films are deposited according to the initial deposition recipe in the PECVD tool at step 520. The thickness of the deposited film is measured and deviation from the predicted thickness is determined in step 530. In step 540 it is determined whether the deviation between the predicted and observed behavior exceeds an established tolerance. If the deviation is within acceptable ranges, no changes are made to the model and the recipe is unchanged (step 550). If the deviation is outside acceptable limits, then this information is marked to trigger a change in the model as described in step 560 and this information is fed back to the model in step 570 and thus into the controller where the deposition recipe is optimized according to an updated model that takes the deviation from the predicted value into consideration. The deposition step can be repeated and further updates of the deposition recipe are possible.

As is the case in most feedback systems, the process variables that are measured on-line (in this case with an integrated metrology unit on the tool) are updated in the model based upon the error between the prediction and the actual measurement. In the case of PECVD-processed films, one or more embodiments of the present invention contemplate that both uniformity and thickness are measured on-line and are used for updating the process model. Other controlled film properties can be measured on-line or off-line. In some cases these measurements would be performed on a lot-to-lot basis. That is, upon completion of the lot (usually 25 wafers) the wafers are brought to an external metrology tool where several wafers of the lot are measured.

In one or more embodiments of the present invention, film properties, e.g., stress and refractive index, are not measured and are handled in much the same way output constraints are handled in model predictive control. The use of output constraints in mode predictive control can be seen in the following optimization relationship:

$$\min_x f(y^{sp}, g(x)) \quad (10)$$

$$\text{s.t. } h(x) \leq 0,$$

where h(x) is some constraint that is placed on the prediction of an unmeasured output. In one or more embodiments of the present invention, output constraints for the PECVD tool are applied to control the prediction of stress and refractive index. This optimization formulation constrains the prediction of the model to be within some limit, or set of limits, while still finding recipe parameters which yield the desired thickness and uniformity. Thus, as long as the recipe parameters are within stated maximum and minimum values, it is assumed that constrained output values are within allowable maximum and minimum values.

In one or more embodiments of the present invention, a feedback control methodology combines the chambers into a single model using the average of the tool states for each of the chambers. The single model would use the feedback approach described above to apportion the bias adjustment across the different chambers in some predetermined way.

When multiple process tools perform in series, also known as being run within a module, the performance of one tool can have a strong effect on the performance of subsequent tools. Accordingly, the performance of subsequent tools may be optimized by adjusting the performance of previous tools. For the specific case of ILD CVD, the standard way of performing the task is to deposit a film that has the most uniform film possible. Then, the ILD CPM is tasked with removing a certain amount of this film with as uniform a removal rate as possible. Unfortunately, the CMP removal profile is not as uniform as the deposition profile from the CVD tool. However, by manipulating the profile which results from the CVD tool, the shortcomings of the CMP tool can be addressed by providing an incoming profile which alleviates the resulting non-uniformities caused by the CMP tool.

Also, in one or more embodiments of the present invention, a feedback control scheme uses the final thickness measurements to distribute feedback individually to all of the chambers. Because each chamber can be can be treated individually, the tool state, i.e., cleaning frequency and idle time, can be included in the model and feedback can be specific to the chamber and deposition recipe. This feedback control scheme is particularly useful when different deposition recipes are being carried out in each chamber or when drift varies between chambers. The ability to separately model each chamber provides a greater of degree processing flexibility, since it allows one to change the processing recipe in one chamber (perhaps because film properties are drifting) while keeping the processing recipe at the remaining chamber unchanged (perhaps where film properties are within target ranges). When changes to the processing recipe are made to only one chamber, chamber-specific processing parameters are adjusted.

Feedback and feedforward control algorithms are constructed for use in the above control process based on the above models using various methods. The algorithms may be used to optimize parameters using various methods, such as recursive parameter estimation. Recursive parameter estimation is used in situations such as these, where it is desirable to update the model on line at the same time as the input-output data is received. Recursive parameter estimation is well suited for making decisions on line, such as adaptive control or adaptive predictions. For more details about the algorithms and theories of identification, see Ljung L., *System Identification—Theory for the User, Prentice Hall*, Upper Saddle River, N.J. 2nd edition, 1999.

In one or more embodiments of the present invention, the deposition recipe may be updated in discrete increments or steps defined in the algorithms of the model. Also, in one or more embodiments of the present invention, the updated recipes may be determined by interpolation to the appropriate parameters.

Additional apparatus utilized to implement the feedforward and feedback loop include tools for measuring a film property, e.g., a film thickness measurement (metrology) tool to provide thickness data needed to calculate film deposition rate. The tool may be positioned relative to the PECVD apparatus so as to provide in-line measurements, or it may be located remote from the apparatus. The tool may use optical, electrical, acoustic or mechanical measurement methods. A suitable thickness measurement device is available from Nanometrics (Milpitas, Calif.) or Nova Measuring Instruments (Phoenix, Ariz.). Other tools may be integrated into the system to provide measurement of film properties, such as trench depth, dopant concentration, refractive index or any other measurable film property that is modeled and controlled. The measurement is made wafer-to-wafer or lot-to-lot and may provide in-line or off-line measurements.

A computer may be utilized to calculate the optimal film deposition recipe based upon the measured film thickness and calculated deposition rate, employing the models and algorithms provided herein. A suitable integrated controller iAPC (integrated advanced process control) is available from Applied Materials (Santa Clara, Calif.).

Figure 6:
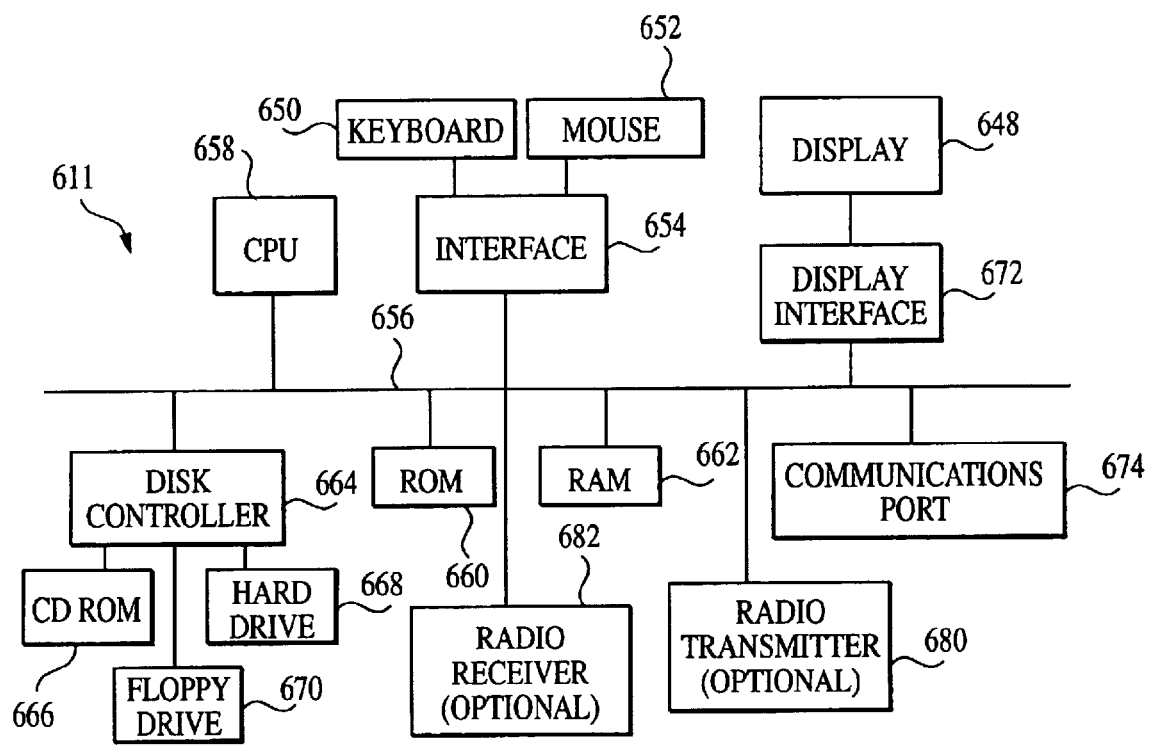
FIG. 6 is a block diagram of a computer system that includes tool representation and access control for use in one or more embodiments of the present invention.

Various aspects of the present invention that can be controlled by a computer can be (and/or be controlled by) any number of control/computer entities, including the one shown in FIG. 6. Referring to FIG. 6 a bus 656 serves as the main information highway interconnecting the other components of system 611. CPU 658 is the central processing unit of the system, performing calculations and logic operations required to execute the processes of embodiments of the present invention as well as other programs. Read only memory (ROM) 660 and random access memory (RAM) 662 constitute the main memory of the system. Disk controller 664 interfaces one or more disk drives to the system bus 656. These disk drives are, for example, floppy disk drives 670, or CD ROM or DVD (digital video disks) drives 666, or internal or external hard drives 668. These various disk drives and disk controllers are optional devices.

A display interface 672 interfaces display 648 and permits information from the bus 656 to be displayed on display 648. Display 648 can be used in displaying a graphical user interface. Communications with external devices such as the other components of the system described above can occur utilizing, for example, communication port 674. Optical fibers and/or electrical cables and/or conductors and/or optical communication (e.g., infrared, and the like) and/or wireless communication (e.g., radio frequency (RF), and the like) can be used as the transport medium between the external devices and communication port 674. Peripheral interface 654 interfaces the keyboard 650 and mouse 652, permitting input data to be transmitted to bus 656. In addition to these components, system 611 also optionally includes an infrared transmitter and/or infrared receiver. Infrared transmitters are optionally utilized when the computer system is used in conjunction with one or more of the processing components/stations that transmits/receives data via infrared signal transmission. Instead of utilizing an infrared transmitter or infrared receiver, the computer system may also optionally use a low power radio transmitter 680 and/or a low power radio receiver 682. The low power radio transmitter transmits the signal for reception by components of the production process, and receives signals from the components via the low power radio receiver. The low power radio transmitter and/or receiver are standard devices in industry.

Although system 611 in FIG. 6 is illustrated having a single processor, a single hard disk drive and a single local memory, system 611 is optionally suitably equipped with any multitude or combination of processors or storage devices. For example, system 611 may be replaced by, or combined with, any suitable processing system operative in accordance with the principles of embodiments of the present invention, including sophisticated calculators, and hand-held, laptop/notebook, mini, mainframe and super computers, as well as processing system network combinations of the same.

Figure 7:
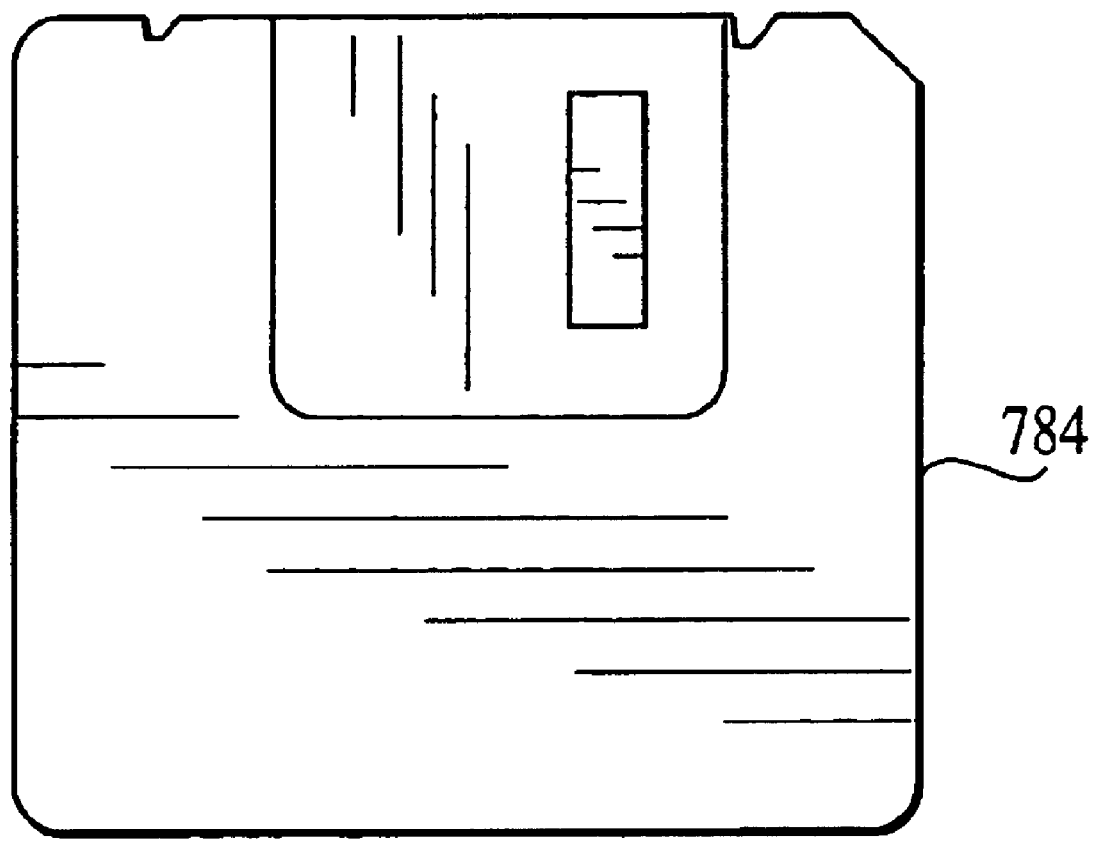
FIG. 7 is an illustration of a floppy disk that may store various portions of the software according to one or more embodiments of the present invention.

FIG. 7 is an illustration of an exemplary computer readable memory medium 784 utilizable for storing computer readable code or instructions. As one example, medium 784 may be used with disk drives illustrated in FIG. 6. Typically, memory media such as floppy disks, or a CD ROM, or a digital video disk will contain, for example, a multi-byte locale for a single byte language and the program information for controlling the above system to enable the computer to perform the functions described herein. Alternatively, ROM 660 and/or RAM 662 illustrated in FIG. 7 can also be used to store the program information that is used to instruct the central processing unit 658 to perform the operations associated with the instant processes. Other examples of suitable computer readable media for storing information include magnetic, electronic, or optical (including holographic) storage, some combination thereof, etc. In addition, at least some embodiments of the present invention contemplate that the medium can be in the form of a transmission (e.g., digital or propagated signals).

In general, it should be emphasized that various components of embodiments of the present invention can be implemented in hardware, software or a combination thereof. In such embodiments, the various components and steps are implemented in hardware and/or software to perform the functions of the present invention. Any presently available or future developed computer software language and/or hardware components can be employed in such embodiments of the present invention. For example, at least some of the functionality mentioned above could be implemented using the C, C++, or any assembly language appropriate in view of the processor(s) being used. It could also be written in an interpretive environment such as Java and transported to multiple destinations to various users.

Although various embodiments that incorporate the teachings of the present invention have been shown and described in detail herein, those skilled in the art can readily devise many other varied embodiments that incorporate these teachings. All references mentioned herein are incorporated by reference.

What is claimed is:

1. A method of film deposition in a chemical vapor deposition (CVD) process, comprising:
    a) providing a model for CVD deposition of a film that defines a plurality of regions on a wafer and identifies one or more film properties for at least two regions of the wafer and at least one deposition model variable that correlates with the one or more film properties;
    b) depositing a film onto a wafer using a first deposition recipe comprising at least one deposition recipe parameter that corresponds to the at least one deposition variable;
    c) measuring a film property of at least one of said one or more film properties for the deposited film of step (b) for each of the at least two regions of the wafers wherein each of the two regions is a distinct substantially annular region;
    d) calculating an updated deposition model based upon the measured film property of step (c) and the model of step (a); and
    e) calculating an updated deposition recipe based upon the updated model of step (d) to maintain a target film property.

2. The method of claim 1, wherein the CVD deposition process is a plasma CVD process.

3. The method of claim 2, wherein the plasma CVD process is a plasma-enhanced CVD process.

4. The method of claim 1, wherein the film property of step (c) is an average film property.

5. The method of claim 1, wherein the film property comprises film thickness.

6. The method of claim 5, wherein the at least one deposition model variable comprises deposition time.

7. The method of claim 5, wherein the first deposition recipe is based on the model of step (a) to obtain the target wafer thickness profile.

8. The method of claim 5, wherein the film thickness for a region j of a wafer in the $i^{th}$ chamber in the model of step (a) is determined according to the equation:

$$\text{Film\_thickness}_{ij} = g(x_1, x_2, \ldots x_n) \cdot \text{time}_i$$

where Film_thickness is film thickness of region j of the wafer in chamber i; $x_1, x_2, \ldots x_n$ are recipe parameters or tool state parameters that effect the deposition rate within region j; $g(\ldots)$ is a function which describes the dependency of $x_1, x_2, \ldots x_n$ on the deposition rate of region j; and time, is the deposition time in the $i^{th}$ chamber.

9. The method of claim 1, wherein the first deposition recipe is determined empirically.

10. The method of claim 1, wherein the plurality of regions in the model of step (a) comprises annular regions extending outward from a center point on the wafer.

11. The method of claim 1, wherein the model defines deposition of a plurality of films onto a plurality of wafers in a plurality of deposition chambers.

12. The method of claim 11, wherein the model provides for independent control of at least one deposition parameter for one or more of said plurality of deposition chambers.

13. The method of claim 11, wherein the model provides for common control of at least one deposition parameter for at least two of said plurality of deposition chambers.

14. The method of claim 11, wherein the deposition recipe of step (b) in each chamber is the same.

15. The method of claim 11, wherein the deposition recipe of step (b) in each chamber is different.

16. The method of claim 11, wherein the calculating step of step (e) comprises calculating updated deposition recipes for one or more of said plurality of deposition chambers.

17. The method of claim 1, wherein the model provides for the effect of tool idle time of the deposition process.

18. The method of claim 17, wherein the model defines a first deposition time when the idle time is more than a predetermined period and a second deposition time when the idle time is less than the predetermined period.

19. The method of claim 17, wherein idle time dependence of the deposition rate is defined as:

$$DR_{idle} = DR_{no\_idle} \cdot (d_1 \cdot \tan^{-1}(d_2 \cdot \text{idle\_time} + d_3) + d_4)$$

where $DR_{idle}$ is the deposition rate with the effect of idle time, $DR_{no\_idle}$ is the deposition rate when there is no idle time, $d_1$ and $d_4$ determines the maximum change in deposition rate which is caused by idle time, $d_2$ determines the rate at which this change occurs, and $d_3$ determines at what idle time the change in deposition rate begins to be significant.

20. The method of claim 1, wherein the model evaluates the reliability of a measurement of a film property.

21. The method of claim 20, wherein the model determines when a recent measurement is outside normal operating variation and, if so, marks the data as suspicious, and ignores the data until a trend is determined from subsequent data.

22. The method of claim 1, wherein the model accounts for a tool state of the CVD process.

23. The method of claim 1, wherein the model provides a methodology for describing the effect of film deposition on the film deposition rate of subsequent wafers.

24. The method of claim 1, wherein the step of providing the model comprises:
(f) depositing a film on at least one wafer in a deposition step using a deposition recipe comprising at least one deposition recipe parameter that corresponds to a deposition model variable;
(g) identifying a plurality of regions on the at least one wafer and measuring a film property for each of the at least one wafers at least two of the plurality of regions after the deposition of step (f); and
(h) recording the deposition parameter and measured film property for at least two of the plurality of regions of the at least one wafer on a recordable medium; and
(i) fitting the data to a linear or non-linear curve that establishes a relationship between the film property of a region of the film and the deposition model variable.

25. The method of claim 24, wherein the model constrains a deposition parameter to within predetermined maximum and minimum values.

26. The method of claim 2 or 24, wherein the at least one deposition parameter includes one or more of the parameters selected from the group consisting of ozone flow rate, oxygen flow rate, reactive gas flow rate, carrier gas flow rate, dopant gas flow rate, RF power, chamber pressure and shower head spacing from the wafer.

27. The method of claim 2 or 24, wherein the model for plasma CVD deposition of a film identifies a relationship between a film deposition variable for the wafer and a film property selected from the group consisting of stress, refractive index, dopant concentration, and extinction coefficient.

28. The method of claim 1, wherein updated model is attained by solving the equation:

$$\min_x f(y^{sp}, g(x))$$

where x is a vector of recipe parameters and other processing parameters corresponding to the deposition recipe; g(x) is the model for the deposition process, $y^{sp}$ is a vector of the one or more film properties; and $f(y^{sp}, g(x))$ is a penalty function to compensate for the deviation between the model predictions g(x) and the desired thicknesses $y^{sp}$.

29. The method of claim 1, wherein the CVD deposition process is an in-line process.

30. The method of claim 1, wherein the CVD deposition process is a batch process.

31. A method of determining a model for a film property in a plasma CVD tool, comprising:
(a) depositing a film on at least one wafer in a plasma CVD deposition step using a deposition recipe having at least one deposition recipe parameter that corresponds to a deposition model variable;
(b) identifying a plurality of regions of the at least one wafer and measuring a film property for the at least one wafers for at least two of the plurality of regions after the deposition of step (a), wherein each of the two regions is a distinct, substantially annular region;
(c) recording the deposition parameter and the measured film property for at least two of the plurality of regions for the at least one wafer on a recordable medium; and
(d) fitting the data to a linear or non-linear curve that establishes a relationship between the film property of a region of the wafer and the deposition model.

32. The method of claim 31, wherein the film property of interest is selected from the group consisting of film thickness, stress, refractive index, dopant concentration and extinction coefficient.

33. The method of claim 31, wherein the at least one deposition parameter comprises one or more parameters selected from the group consisting of deposition time, ozone flow rate, oxygen flow rate, reactive gas flow rate, carrier gas flow rate, dopant gas flow rate, RF power, chamber pressure and shower head spacing from the wafer.

34. The method of claim 31, wherein the model constrains a deposition parameter to be within predetermined maximum and minimum values.

35. A plasma chemical vapor deposition (CVD) tool for deposition of a film, comprising:
a plasma CVD) apparatus comprising a chamber, a vacuum system, an RF generator for generating a source plasma, and a gas delivery system;
controlling means capable of controlling an operating parameter of the deposition process; and
a controller operatively coupled to the controlling means, the controller operating the controlling means to adjust the operating parameter of the deposition process as a function of a model for a film property, the model comprising:
a deposition model for plasma CVD deposition of a film that identifies one or more film properties of the film and at least one deposition model variable that correlates with the one or more film properties, wherein the model defines a plurality of regions on a wafer and identifies a deposition variable and a film property for each of at least two regions of the wafer, wherein each of the two regions is a distinct, substantially annular region.

36. The tool of claim 35, wherein the operating parameter comprises a parameter selected from the group consisting of deposition time, ozone flow rate, oxygen flow rate, reactive gas flow rate, carrier gas flow rate, dopant gas flow rate, RF power, chamber pressure and shower head spacing from the wafer.

37. The tool of claim 35, wherein the film property is selected from the group consisting of film thickness, stress, refractive index, dopant concentration, and extinction coefficient.

38. The tool of claim 35, wherein the model defines deposition of a plurality of films onto a plurality of wafers in a plurality of deposition chambers.

39. The tool of claim 38, wherein the model provides for independent control of at least one operating parameter for one or more of said plurality of deposition chambers.

40. The tool of claim 38, wherein model provides for common control of at least one operating parameter for at least two of said plurality of deposition chambers.

41. The tool of claim 38, wherein the deposition recipe of step (b) in each chamber is the same.

42. The tool of claim 38, wherein the deposition recipe of step (b) in each chamber is different.

43. The tool of claim 38, wherein the calculating step of step (e) comprises calculating updated deposition recipes for one or more of the plurality of deposition chambers.

44. The tool of claim 38, wherein the model provides for the effect of tool idle time of the deposition process.

45. The tool of claim 44, wherein the model defines a first deposition time when the idle time is more than a predetermined period and a second deposition time when the idle time is less than the predetermined period.

46. The tool of claim 35, wherein the model evaluates the reliability of a measurement of a film property.

47. The tool of claim 35, wherein the model provides methodology to describe for the effect of film deposition on the film deposition rate of subsequent wafers.

48. A method of film deposition in a plasma chemical vapor deposition (CVD) process, comprising:
   a) providing a model for plasma CVD deposition of a film that identifies one or more film properties for the wafer and at least one deposition model variable that correlates with the film property;
   b) depositing a film onto a wafer using a first deposition recipe using a deposition recipe comprising at least one deposition parameter that corresponds to at least one deposition variable;
   c) measuring, in at least two distinct, substantially annular regions, the film property for at least one of said one or more film properties for the deposited film of step (b) for the wafer;
   d) calculating an updated deposition model based upon the measured film property of step (c) and the model of step (a); and
   e) calculating an updated deposition recipe based upon the updated model of step (d) to maintain a target film property profile.

49. The method of claim 48, wherein the film property of step (c) is an average film property.

50. The method of claim 48, wherein the plasma CVD process is a plasma-enhanced CVD process.

51. The method of claim 48, wherein the model defines deposition of a plurality of films onto a plurality of wafers in a plurality of deposition chambers.

52. The method of claim 51, wherein the model provides for independent control of at least one deposition parameter for one or more of said plurality of deposition chambers.

53. The method of claim 51, wherein model provides for common control of at least one deposition parameter for at least two of said plurality of deposition chambers.

54. The method of claim 51, wherein the deposition recipe of step (b) in each chamber is the same.

55. The method of claim 51, wherein the deposition recipe of step (b) in each chamber is different.

56. The method of claim 51, wherein the calculating step of step (e) comprises calculating updated deposition recipes for one or more of said plurality of deposition chambers.

57. The method of claim 48, wherein the model provides for the effect of tool idle time of the deposition process.

58. The method of claim 57, wherein the model defines a first deposition time when the idle time is more than a predetermined period and a second deposition time when the idle time is less than the predetermined period.

59. The method of claim 48, wherein the deposition parameter comprises a parameter selected from the group consisting of deposition time, ozone flow rate, oxygen flow rate, reactive gas flow rate, carrier gas flow rate, dopant gas flow rate, RF power, chamber pressure and shower head spacing from the wafer.

60. The method of claim 48, wherein the film property is selected from the group consisting of film thickness, stress, refractive index, dopant concentration, and extinction coefficient.

61. A computer readable medium comprising instructions being executed by a computer, the instructions including a computer-implemented software application of a chemical vapor deposition (CVD) process, the instructions for implementing the process comprising:
   (a) receiving data from a CVD tool relating to a deposition parameter and a measured film property for at least two of a plurality of regions for at least one wafer, wherein each of the two regions is a distinct, substantially annular region;
   (b) calculating, from the data of step (a), a deposition model, wherein the model is calculated by determining the relationship between the film property of a region of a wafer and the deposition parameter.

62. The medium of claim 61, further comprising:
   c) calculating, using the updated model of step (b) and a target output value for the film property, an updated deposition recipe.

63. The medium of claim 61, wherein the data of step (a) further includes one or more deposition parameters selected from the group consisting of deposition time, ozone flow rate, oxygen flow rate, reactive gas flow rate, carrier gas flow rate, dopant gas flow rate, RF power, chamber pressure and shower head spacing from the wafer.

64. The medium of claim 61, wherein the film property is selected from the group consisting of film thickness, stress, refractive index, dopant concentration, and extinction coefficient.

65. The medium of claim 61, wherein the model provides for independent control of at least one deposition parameter for each deposition chamber.

66. The medium of claim 61, wherein the model constrains a deposition parameter to be within predetermined maximum and minimum values.

67. A chemical vapor deposition (CVD) tool for deposition of a film, comprising:
   a) modeling means for defining a plurality of regions on a wafer and identifying one or more film properties for at least two of the regions of the wafer;
   b) means for depositing a film onto a wafer using a first deposition recipe comprising at least one deposition parameter, wherein the at least one deposition parameter corresponds to a deposition model variable;
   c) means for measuring a film property for at least one of said one or more film properties for the deposited film of step (b) for at least two regions of the wafer, wherein each of the two regions is a distinct, substantially annular region;
   d) means for calculating an updated model based upon the measured film property of step (c) and the model of step (a); and
   e) means for calculating an updated deposition recipe based upon the updated model of step (d) to maintain a target film property.

68. The CVD tool of claim 67, wherein the CVD process is a plasma CVD process.

69. The CVD tool of claim 67, wherein the model defines deposition of a plurality of films onto a plurality of wafers in a plurality of deposition chambers.

70. The CVD tool of claim 69, wherein the model provides for independent control of at least one deposition parameter for at least two of said plurality of deposition chambers.

71. The CVD tool of claim 69, wherein model provides for common control of at least one deposition parameter for at least two of said plurality of deposition chambers.

72. The CVD tool of claim 69, wherein the deposition recipe of step (b) in each chamber is the same.

73. The CVD tool of claim 69, wherein the deposition recipe of step (b) in each chamber is different.

74. The CVD tool of claim 69, wherein the calculating step of step (e) comprises calculating updated deposition recipes for at least two of said plurality of deposition chambers.

75. The CVD tool of claim 69, wherein the model provides for the effect of tool idle time of the deposition process.

76. The CVD tool of claim 75, wherein the model defines a first deposition time when the idle time is more than a predetermined period and a second deposition time when the idle time is less than the predetermined period.

77. method of film deposition in a chemical vapor deposition (CVD) process, comprising:
   a) providing a model for CVD deposition of a film that identifies one or more film properties and at least one deposition model variable that correlates with the one or more film properties and that provides for the effect of tool idle time on the deposition process;
   b) depositing a film onto a wafer using a first deposition recipe comprising at least one deposition recipe parameter that corresponds to the at least one deposition variable;
   c) measuring a film property of at least one of said one or more film properties for the deposited film of step (b);
   (d) calculating an updated deposition model based upon the measured film property of step (c) and the model of step (a); and
   (e) calculating an updated deposition recipe based upon the updated model of step (d) to maintain a target film property.

78. The method of claim 77, wherein the model defines a first deposition time when the idle time is more than a predetermined period and a second deposition time when the idle time is less than the predetermined period.

79. The method of claim 77, wherein idle time dependence of the deposition rate is defined as:

$$DR_{idle} = DR_{no\_idle} \cdot (d_1 \cdot \tan^{-1}(d_2 \cdot \text{idle\_time} + d_3) + d_4)$$

where $DR_{idle}$ is the deposition rate with the effect of idle time, $DR_{no\_idle}$ is the deposition rate when there is no idle time, $d_1$ and $d_4$ determines the maximum change in deposition rate which is caused by idle time, $d_2$ determines the rate at which this change occurs, and $d_3$ determines at what idle time the change in deposition rate begins to be significant.

80. A method of film deposition in a chemical vapor deposition (CVD) process, comprising:
   a) providing a model for CVD deposition of a film that identifies one or more film properties and at least one deposition model variable that correlates with the one or more film properties and that evaluates the reliability of a measurement of a film property;
   b) depositing a film onto a wafer using a first deposition recipe comprising at least one deposition recipe parameter that corresponds to the at least one deposition variable;
   c) measuring a film property of at least one of said one or more film properties for the deposited film of step (b);
   (d) calculating an updated deposition model based upon the measured film property of step (c) and the model of step (a); and
   (e) calculating an updated deposition recipe based upon the updated model of step (d) to maintain a target film property.

81. The method of claim 80, wherein the model determines when a recent measurement is outside normal operating variation and, if so, marks the data as suspicious, and ignores the data until a trend is determined from subsequent data.

* * * * *